(12) United States Patent
Arik et al.

(10) Patent No.: US 7,010,930 B2
(45) Date of Patent: Mar. 14, 2006

(54) METHOD AND SYSTEM FOR COOLING HIGH POWER DENSITY DEVICES

(75) Inventors: Mehmet Arik, Niskayuna, NY (US); Warren Bessler, Amsterdam, NY (US); Michael Bowman, Niskayuna, NY (US); Charles Byrd, Redwood City, CA (US); William Gerstler, Niskayuna, NY (US); Daniel P. Smith, Ballston Spa, NY (US); Todd Wetzel, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 218 days.

(21) Appl. No.: 10/670,533

(22) Filed: Sep. 24, 2003

(65) Prior Publication Data

US 2004/0221603 A1 Nov. 11, 2004

Related U.S. Application Data

(63) Continuation-in-part of application No. 10/065,985, filed on Dec. 6, 2002.

(51) Int. Cl.
*F25D 23/12* (2006.01)
(52) U.S. Cl. ...................... 62/259.2; 62/500
(58) Field of Classification Search .............. 62/259.2, 62/296, 500, 505; 361/68
See application file for complete search history.

(56) References Cited

U.S. PATENT DOCUMENTS

| | | | |
|---|---|---|---|
| 5,176,000 A * | 1/1993 | Dauksis | 60/618 |
| 5,380,956 A | 1/1995 | Loo et al. | 174/252 |
| 5,968,680 A * | 10/1999 | Wolfe et al. | 429/13 |
| 6,029,742 A | 2/2000 | Burward-Hoy | 165/80.4 |
| 6,033,506 A | 3/2000 | Klett | 156/78 |
| 6,119,987 A | 9/2000 | Kiknadze et al. | 244/204 |
| 6,161,768 A * | 12/2000 | Gordon et al. | 237/12.1 |
| 6,198,627 B1 | 3/2001 | Roehling et al. | 361/688 |
| 6,438,984 B1 | 8/2002 | Novotny et al. | 62/259.2 |
| 6,468,150 B1 | 10/2002 | Langdon et al. | 454/184 |
| 6,587,335 B1 | 7/2003 | Nelson et al. | 361/687 |
| 2002/0010743 A1 | 1/2002 | Ryan et al. | 709/205 |

FOREIGN PATENT DOCUMENTS

| | | |
|---|---|---|
| DE | 196 25 606 A1 | 1/1998 |
| JP | 2002-26560 | 1/2002 |

OTHER PUBLICATIONS

A copy of the Patent Cooperation Treaty International Search Report dated Jul. 13, 2004.
Abdel-Rahman, E. et al. "Size Considerations in Interfacing Thermoacoustic Coolers with Electronics". 2002 Inter Society Conference on Thermal Phenomena, pp. 421-424.
Afanas'yev, V.N. et al. "Thermohydraulics of Flow Over Isolated Depressions (Pits, Grooves) in a Smooth Wall". Heat Transfer Research, Vo. 25, No. 1, 1993, pp. 22-56.

(Continued)

*Primary Examiner*—Melvin Jones
(74) *Attorney, Agent, or Firm*—Cantor Colburn LLP

(57) ABSTRACT

A turbomachinery system for cooling a high power density device includes a turbomachine configured to deliver a high flux cooling medium toward the high power density device, a housing containing a motor, a compressor, or both, of the turbomachine, a heat exchanger in fluid communication with the turbomachine and arranged for being thermally coupled to the high power density device, and a transition duct arranged intermediate the heat exchanger and turbomachine.

20 Claims, 19 Drawing Sheets

OTHER PUBLICATIONS

Afanas'yev, V.N. et al. "Turbulent Flow Friction and Heat Transfer Characteristics for Spherical Cavities on a Flat Plate". Experimental Thermal and Fluid Science, vol. 7, 1993, pp. 1-8.

Bash, Cullen E et al. "Acoustic Compression for the Thermal Management of Multi-Load Electronic Systems". 2002 Inter Societ Conference on Thermal Phenomena, pp. 395, 402.

Chyu, M.K. et al. "Concavity Enhanced Heat Transfer in an Internal Cooling Passage". IGTI Turbo Expo, Paper No. 97-GT-437, Orlando, 1997, pp. 1-7.

Dickenson, Randall D. et al. "A System Design Approach to Liquid-Cooled Microprocessors". 2002 Inter Society Conference on Thermal Phenomena, pp. 413-420.

Gillespie, D. et al. "Detailed Flow and Heat Transfer Coefficient Measurements in a Model of an Internal Cooling Geometry Employing Orthogonal Intersecting Channels". Paper No. 2000-GT-653, IGTI Turbo Expo, Munich, 2000, pp. 1-8.

Goreloff, V. et al. "The Investigation of Heat Transfer in Cooled Blades of Gas Turbines". AIAA Paper No. 90-2144, 26$^{th}$ Joint Propulsion Conference, Orlando, 1990, p. 1-5.

Heydari, Ali. "Miniature Vapor Compression Refrigeration Systems for Active Cooling of High Performance Computers". 2002 Inter Society Conference on Thermal Phenomema, pp. 371-378.

Kesarev, V.S. et al. "Convective Heat Transfer in Turbulized Flow Past a Hemispherical Cavity". Heat Transfer Research, vol. 25, 1993, pp. 156-160.

Osgood, Sarah. "Heat Transfer in Carbon Foams". Master's Thesis, Department of Mechanical Engineering, Renssellaer Polytechnic Institute, Troy, NY, Dec. 2001.

* cited by examiner

METHOD AND SYSTEM FOR COOLING HIGH POWER DENSITY DEVICES

CROSS REFERENCE TO RELATED APPLICATIONS

This application claims the benefit of U.S. patent application filed on Dec. 6, 2002 having Ser. No. 10/065,985, which is herein incorporated by reference in its entirety.

BACKGROUND OF THE INVENTION

The present disclosure relates generally to the cooling of high power density devices, and particularly to the use of turbomachinery for cooling high power density devices.

The cooling of high power density devices (HPDD's), such as high power density integrated circuits (IC's) and central processing units (CPU's) for example, is a significant consideration in the design of computer servers, military avionic equipment, medical imaging equipment, and other systems employing high power density electronic devices. The term HPDD used herein refers to heat generating devices having a heat flux in excess of 100 Watts-per-square-centimeter. Today's trend is not only to design electronic systems with greater and greater computational speed and power, but also to design them with smaller and smaller footprints, the end result being a HPDD that generates a lot of heat in a small area that needs to be dissipated in order to avoid IC and CPU degradation. While the power density of today's electronic systems may be as high as 200 watts per square centimeter (W/sq-cm), the trend is toward 800 W/sq-cm or beyond over the next several years. In addition to heat generation, enclosure size constraints must also be taken into consideration. For example, today's computer servers typically employ circuit boards that are housed in enclosures with a height restriction of 1.75 inches, referred to as a 1U application, with multiple circuit boards being stacked adjacent one another in a rack chassis. With a typical electronic component having an ambient use temperature of no greater than 120 degree-Celsius (deg-C.) and a junction temperature restriction of 90 deg-C., cooling systems are employed to transfer the heat of the HPDD to the surrounding ambient. Typical cooling systems employed today include fans, blowers, heat sinks, and refrigeration systems, which tend to increase in size as the heat transfer demands increase. This size increase, however, is contrary to the design objective of a 1U application.

SUMMARY OF THE INVENTION

In one embodiment, a turbomachinery system for cooling a high power density device includes a turbomachine configured to deliver a high flux cooling medium toward the high power density device, a housing containing a motor, a compressor, or both, of the turbomachine, a heat exchanger in fluid communication with the turbomachine and arranged for being thermally coupled to the high power density device, and a transition duct arranged intermediate the heat exchanger and turbomachine.

In another embodiment, a method for cooling a high power density device includes drawing air through a porous medium using a turbomachine, compressing the air at a turbocompressor, and exhausting the drawn and compressed air. The porous medium includes a plurality of interconnected flow paths and is arranged for being thermally coupled to the high power density device. The turbomachine has an overall dimension of equal to or less than 1U.

In a further embodiment, a method for cooling a high power density device includes drawing air through a heat exchanger using a turbomachine, compressing the air at a turbocompressor, sensing a noise generated at the turbomachine, generating a phase-shifted sound wave in response to the sensed noise for at least partially cancelling the noise generated at the turbomachine, and exhausting the drawn, compressed and noise-reduced air. The heat exchanger is arranged for being thermally coupled to the high power density device, and the turbomachine is configured with an overall dimension of equal to or less than 1U.

In yet another embodiment, a turbomachinery system for cooling a high power density device includes a turbomachine configured to deliver a high flux cooling medium toward the high power density device, a porous heat exchanger in fluid communication with the turbomachine and arranged for being thermally coupled to the high power density device, an audio sensor arranged for sensing noise generated at the turbomachine, and a noise generating device responsive to the audio sensor and arranged for at least partially cancelling the noise generated at the turbomachine.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the present invention provides an apparatus and method for cooling a high power density device such as a high-end integrated circuit (IC) for use in a server computer system using small turbomachinery, such as a micro turbocompressor, and a high flux heat exchanger. The turbomachinery is sized for applications having a dimensional restriction of 1.75 inches ("1U" applications). While the embodiment described herein depicts an integrated circuit as an exemplary high power density device, it will be appreciated that the disclosed invention is also applicable to other high power density devices, such as military avionics and medical imaging componentry and equipment for example.

Figure 2:
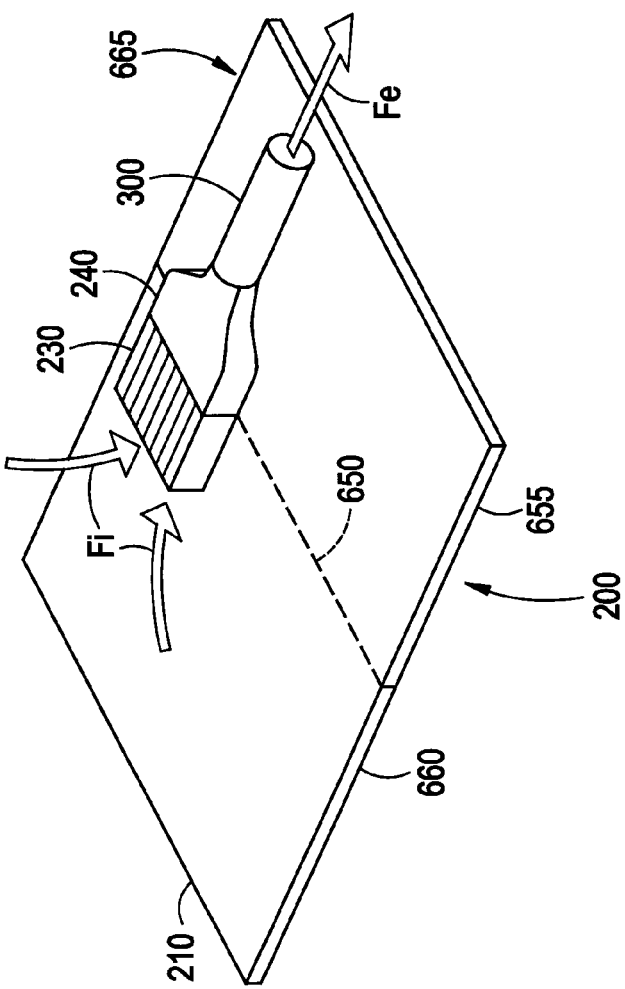
FIG. 2 depicts an isometric view of a turbomachinery system in accordance with an embodiment of the invention.
Figure 1:
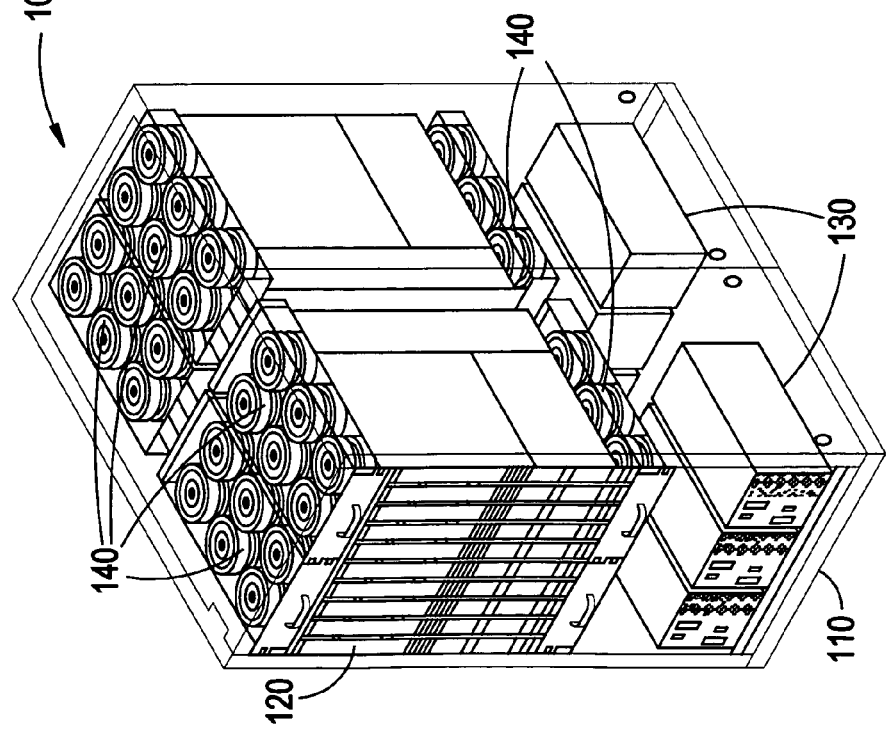
FIG. 1 depicts a computer server system for use with an embodiment of the invention.

FIG. 1 is an exemplary embodiment of a computer server system 100 utilizing an embodiment of the invention, the system 100 including a mounting fixture 110 and a plurality of system circuit boards 120, with each circuit board 120 having a turbomachinery system 200, best seen by now referring to FIG. 2.

An embodiment of turbomachinery system 200 is depicted in FIG. 2 having a mounting surface 210, which may be a section of circuit board 120 or a separate modular support structure, a high power density device (HPDD) (e.g., an integrated circuit) 220 (seen in FIG. 3) coupled to surface 210, a turbomachine 300 coupled to surface 210 for delivering high flux air (a first type of cooling medium), a heat exchanger 230 thermally coupled to HPDD 220, and a transition duct 240 arranged intermediate heat exchanger 230 and turbomachine 300 for funneling the air flow from heat exchanger 230 to turbomachine 300. The term high flux air used herein refers to air flow on the order of 150 pounds-per-hour (lbs/hr) or greater, as will be discussed in more detail below. Turbomachinery system 200 has an overall dimension "D" not greater than 1.75 inches, thereby making it suitable for 1U applications. An alternative embodiment of transition duct 240 is discussed below in reference to FIGS. 22 and 23.

Heat exchanger 230 may be any heat exchanger suitable for the cooling requirements of the application, but preferably is a heat exchanger that is not susceptible to fouling, thereby avoiding stalling of turbomachine 300 from excessive pressure drop across heat exchanger 230, as will be discussed in more detail below in reference to FIGS. 15–19. In an alternative embodiment, heat exchanger 230 has acoustical damping characteristics, which may be achieved through material selection, material deposition, or geometric design, which will be discussed in more detail below in reference to FIG. 25.

Figure 4:
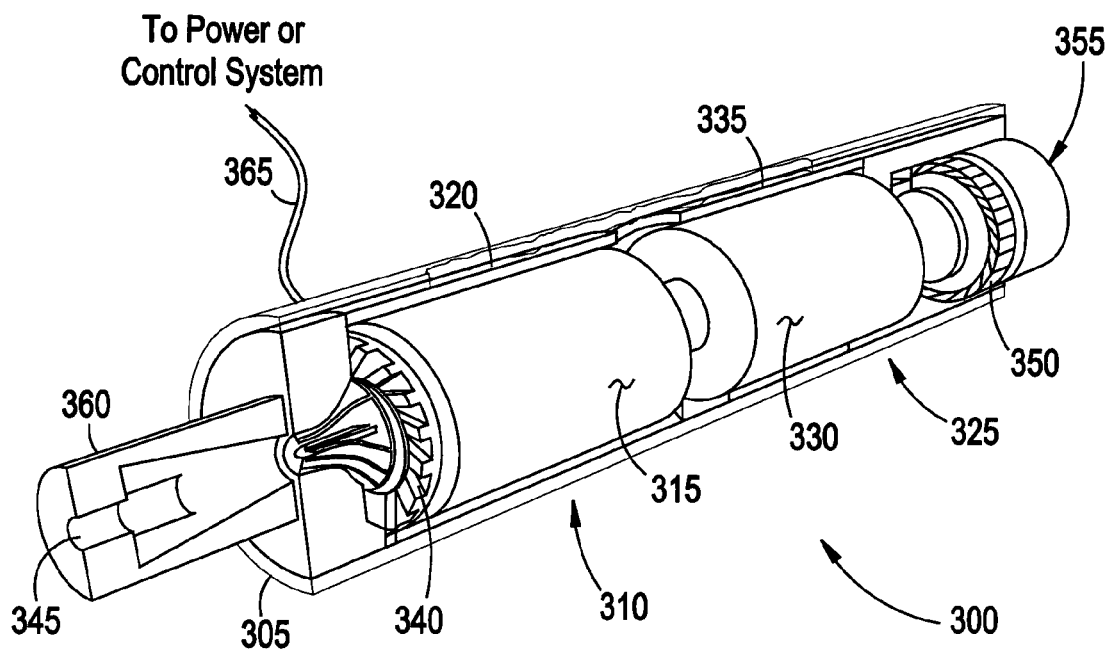
FIG. 4 depicts a turbomachine in accordance with an embodiment of the invention.

Turbomachine 300, as best seen by now referring to FIG. 4, includes a housing 305, a first motor 310 having a first rotor 315 and a first stator 320, an optional second motor 325 having a second rotor 330 and a second stator 335, a compressor 340 driven by motor 310, 325 for compressing the high flux air as it enters turbomachine 300 at an inlet 345, and an optional expansion turbine 350 driven by motor 310, 325 for expanding the high flux air as it is discharged from turbomachine 300 at an outlet 355. An optional ejector 360 at the inlet end of turbomachine 300 may be included for controlling the air flow at inlet 345.

Motors 310, 325 preferably have magnetic bearings or other non-contact bearing solutions, thereby reducing frictional effects for improved overall efficiency, reduced heat generation, reduced wear, and prolonged life.

Figure 5:
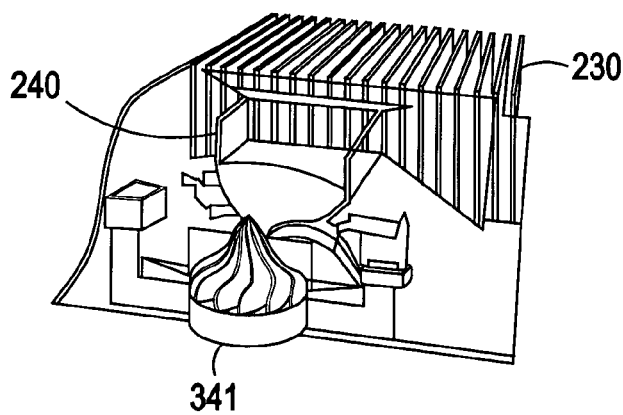
FIG. 5 depicts a centrifugal compressor for use in an embodiment of the invention.
Figure 6:
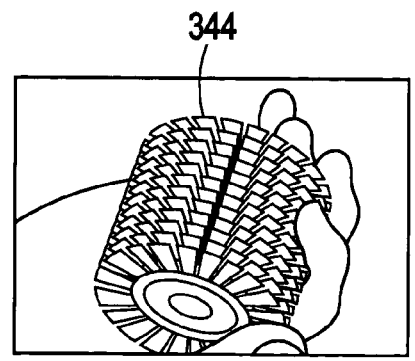
FIG. 6 depicts a multi-wheel axial compressor for use in an embodiment of the invention.

Compressor 340 may be either an axial compressor or a centrifugal compressor, and may be arranged as a single wheel compressor or a multi-wheel compressor. FIG. 4 depicts compressor 340 as a single wheel axial compressor, while FIGS. 5 and 6 depict a centrifugal compressor 341 and a multi-wheel axial compressor 342, respectively.

Under operating conditions, turbomachine 300 receives power from wires 365 to energize motors 310, 325. Wires 365 are connected to power supplies 130 in system 100 using appropriate wire connection means (not shown). Motors 310, 325 drive compressor 340 and optional expansion turbine 350 at a high rate of speed, on the order of 50,000 revolutions-per-minute (RPM) for example, thereby drawing air into inlet 345, compressing the air at compressor 340, driving the air along the length of housing 305, and optionally expanding and exhausting the air at expansion turbine 350 and outlet 355. As the high flux air is drawn through turbomachine 300 it is also drawn through transition duct 240 and across heat exchanger 230 (see FIG. 2), thereby providing for the transfer of heat from HPDD 220 to ambient through heat exchanger 230 (see FIG. 3). Inlet and exhaust flow arrows Fi, Fe, shown in FIG. 2, depict the direction of air flow, indicating that turbomachine 300 is downstream from HPDD 220 and heat exchanger 230, which avoids the heat of motors 310, 325 from negatively influencing the cooling performance of heat exchanger 230. However, under appropriate circumstances, turbomachine 300 may be arranged upstream from HPDD 220 and heat exchanger 230, which may be achieved by reversing the flow of air through turbomachine 300. Housing 305 may be arranged to contain compressor 340, motor 310, 325, and optional expansion turbine 350, or alternatively, may be arranged to contain only compressor 340, as will be discussed in more detail below. Surface 210 may include more than one HPDD 220, and typically includes many circuit components, including both high and low power density devices.

The air drawn across heat exchanger 230 and exhausted through outlet 355 by turbomachine 300 may be drawn from the ambient internal to or external of mounting fixture 110, and may be exhausted to the ambient internal to or external of mounting fixture 110, depending on the system cooling needs. Duct work to accomplish the alternative air flows may be accomplished by incorporating air ducts into the structure of the optional fan trays 140, or alternatively replacing the optional fan trays 140 with appropriate air ducts.

Figure 7:
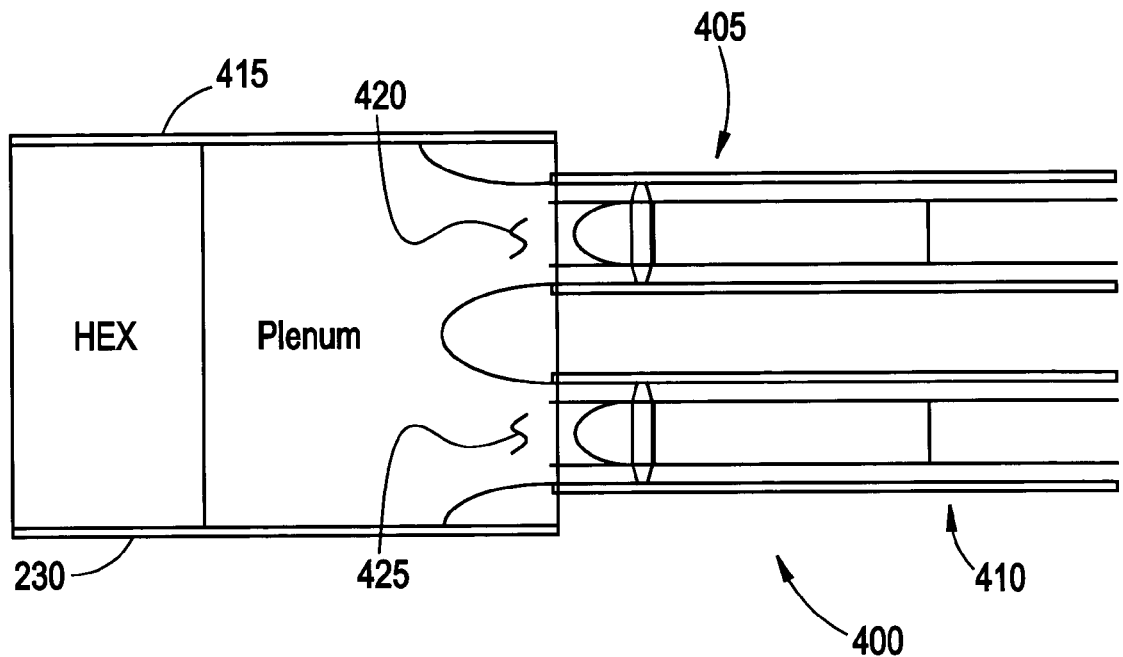
FIG. 7 depicts an alternative embodiment to the turbomachinery system of FIGS. 2 and 3.

In an alternative embodiment that employs a parallel system 400, as depicted in FIG. 7, turbomachine 300 is replaced by two turbomachines 405, 410 arranged in parallel, and transition duct 240 is replaced by transition duct 415 having dual outlet ports 420, 425 for delivering high flux air flow to turbomachines 405, 410. See the discussion below in reference to FIGS. 22 and 23 for an alternative embodiment of transition duct 415. High flux air flow across heat exchanger 230 is similar to that described above. The operation of turbomachines 405, 410 and the geometry of outlet ports 420, 425 provide equivalent air flow through each turbomachine 405, 410. Regarding the single turbomachine configuration of FIG. 2, it has been estimated that a 320 Watt motor in turbomachine 300 having a diameter of 1.5 inches and a length of 1 inch would be required in order to deliver 0.1 pounds-per-second (lbs/sec) of air at a motor speed of 50,000 revolutions-per-minute (RPM), a pressure ratio of 1.04, a compressor efficiency of 0.6, and a motor efficiency of 0.8, while in the dual turbomachine configuration of FIG. 7, the same total air flow characteristics would be achieved by employing 160 Watt motors in each of the two turbomachines 405, 410. While the total power requirements of the two configurations are the same, the power requirement for a given turbomachine in the two configurations differs by a factor of 2:1, which is substantial for a turbomachine having an overall dimension limited to no greater than 1.75 inches.

In another alternative embodiment that employs either a single turbomachine 300, as in turbomachinery system 200 of FIG. 2, or parallel turbomachines 405, 410, as in the parallel system 400 of FIG. 7, an air particle ionizer arranged upstream of heat exchanger 230 and an air particle deionizer arranged downstream of the outlets of turbomachines 300, 405, 410 serve to ionize and deionize the air particles to prevent particulate fouling and improve system life. Prior to entering heat exchanger 230 and turbomachines 300, 405, 410, the air particles are ionized in order to prevent particulate fouling. Upon discharge from turbomachines 300, 405, 410, the air particles are deionized in order to neutralize the electrical charge of the air particles to prevent static buildup on electrical components within system 100.

Figure 8:
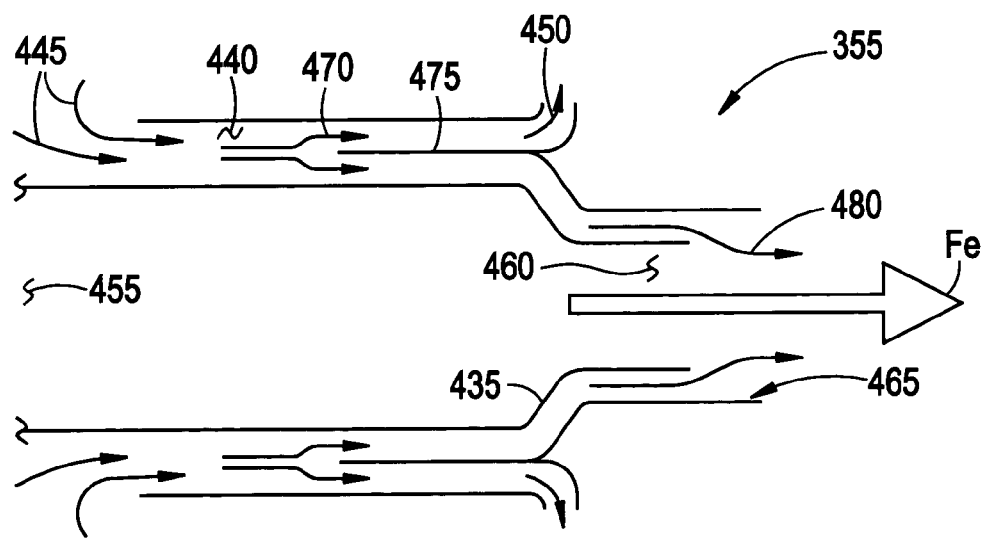
FIG. 8 depicts an alternative embodiment to the turbomachine of FIG. 4.

In an alternative embodiment that employs turbomachinery system 200, outlet 355 of housing 305 includes an entrainment nozzle 435 having a secondary air duct 440 for entraining ambient air 445 for providing a secondary cooling air flow 450 as depicted in FIG. 8. Referring to FIG. 8, which depicts a cross section view of entrainment nozzle 435, the entry 455 of entrainment nozzle 435 is attached to outlet 355 of turbomachine 300 such that air flow through turbomachine 300 passes through outlet 355, into entry 455 of entrainment nozzle 435, and out the exhaust port 460 as indicated by exhaust flow arrow Fe. The exhausting air flow Fe creates a suction at entrainment port 465 that draws ambient air 445 into secondary air duct 440. The secondary air flow 470 is bifurcated at internal wall section 475 resulting in a secondary exhaust air flow 480 that mixes with and exhausts with exhaust flow Fe, and a secondary cooling air flow 450 that is directed as needed for additional cooling. Entrainment nozzle 435 may be integral with outlet 355 of turbomachine 300 or separately attached using known means such as bolts, screws, or welding for example.

Figure 9:
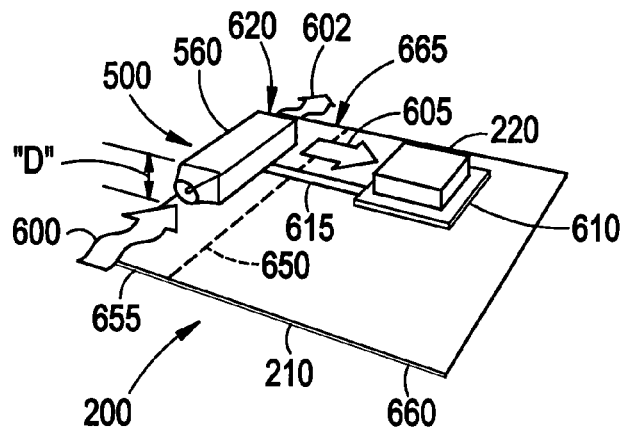
FIG. 9 depicts an isometric view of an alternative embodiment to the turbomachinery system of FIG. 2.

Another embodiment of turbomachinery system 200 is depicted in FIG. 9 having a mounting surface 210, which may be a section of circuit board 120 or a separate modular support structure, a high power density device (HPDD) (e.g., an integrated circuit) 220 coupled to surface 210, and a turbomachine 500 that replaces turbomachine 300, heat exchanger 230 and transition duct 240 of FIG. 2. Turbomachine 500 is coupled to surface 210 and delivers high flux cooled air (a first type of cooling medium) and high flux refrigerant (a second type of cooling medium) for cooling HPDD 220. Alternatively, turbomachine 500 may deliver only high flux cooled air or high flux refrigerant, as will be discussed below in more detail. Turbomachinery system 200 has an overall dimension "D" not greater than 1.75 inches, thereby making it suitable for 1U applications. In an embodiment, turbomachinery system 200 is integral with circuit board 120, which fits inside mounting fixture 110 of system 100 depicted in FIG. 1.

Figure 10:
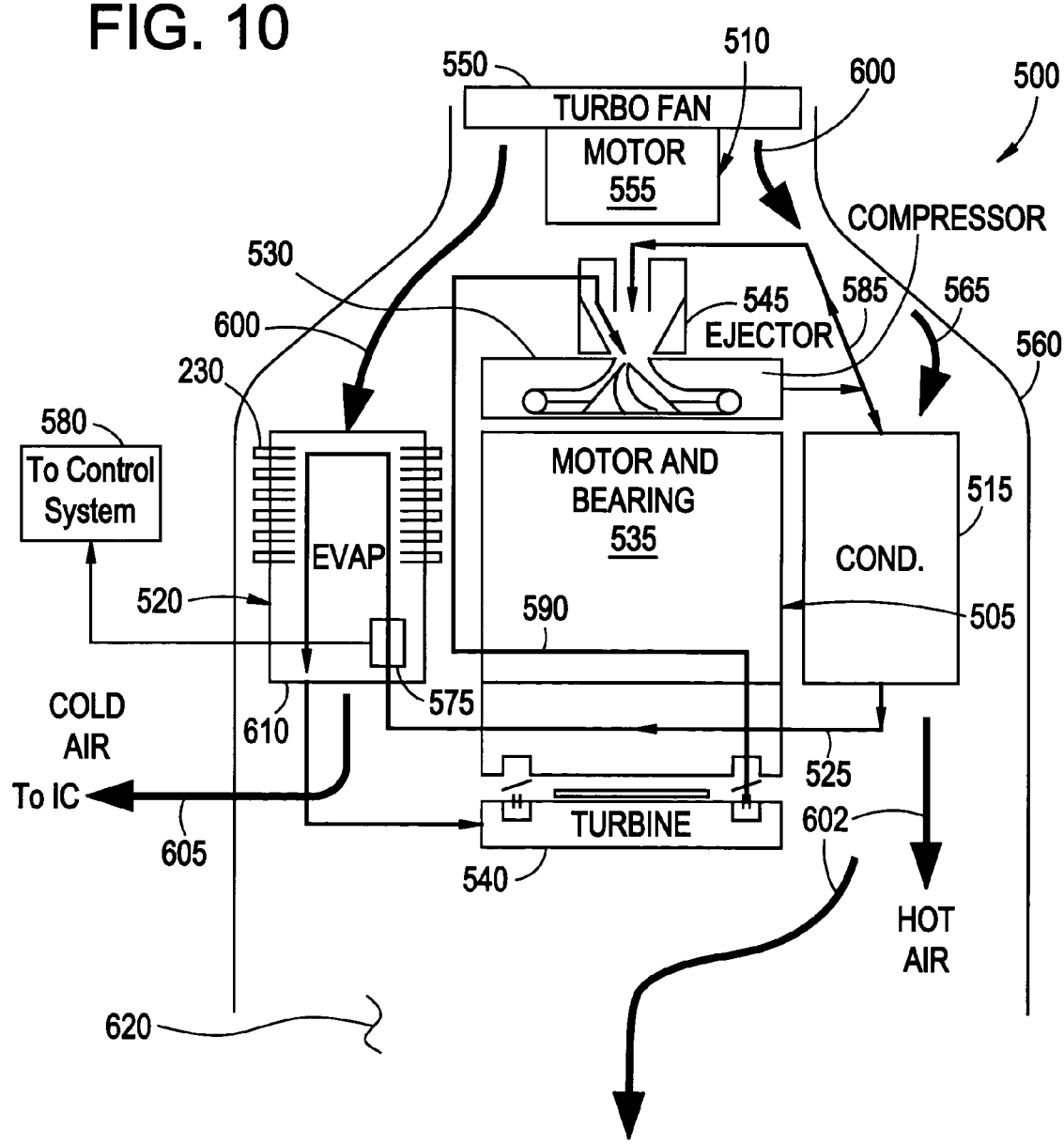
FIG. 10 depicts an alternative embodiment to the turbomachine of FIG. 4.

Turbomachine 500, best seen by now referring to FIG. 10, includes a first turbomachine 505, a second turbomachine 510, a condensor 515, and an expander/evaporator 520. First turbomachine 505, condenser 515 and expander/evaporator 520 are part of a closed-loop refrigeration cycle (CLRC) 525. First turbomachine 505 includes a compressor 530, a motor 535, preferably with magnetic bearings, a turbine 540, and an optional ejector 545. Motor 535 drives both compressor 530 and turbine 540. Expander/evaporator 520 may consist of a cold plate, a heat exchanger, or both. Second turbomachine 510 includes a turbofan 550 and a motor 555, which preferably has magnetic bearings. Surrounding turbomachine 500 is a housing 560 to provide air flow passages for directing high flux air flow across condensor 515 and expander/evaporator 520, as will be discussed in more detail below.

Under operating conditions, first turbomachine 505 operates to drive a refrigerant through CLRC 525, and second turbomachine 510 operates to drive high flux air across condenser 515 and evaporator/expander 520.

Figure 11:
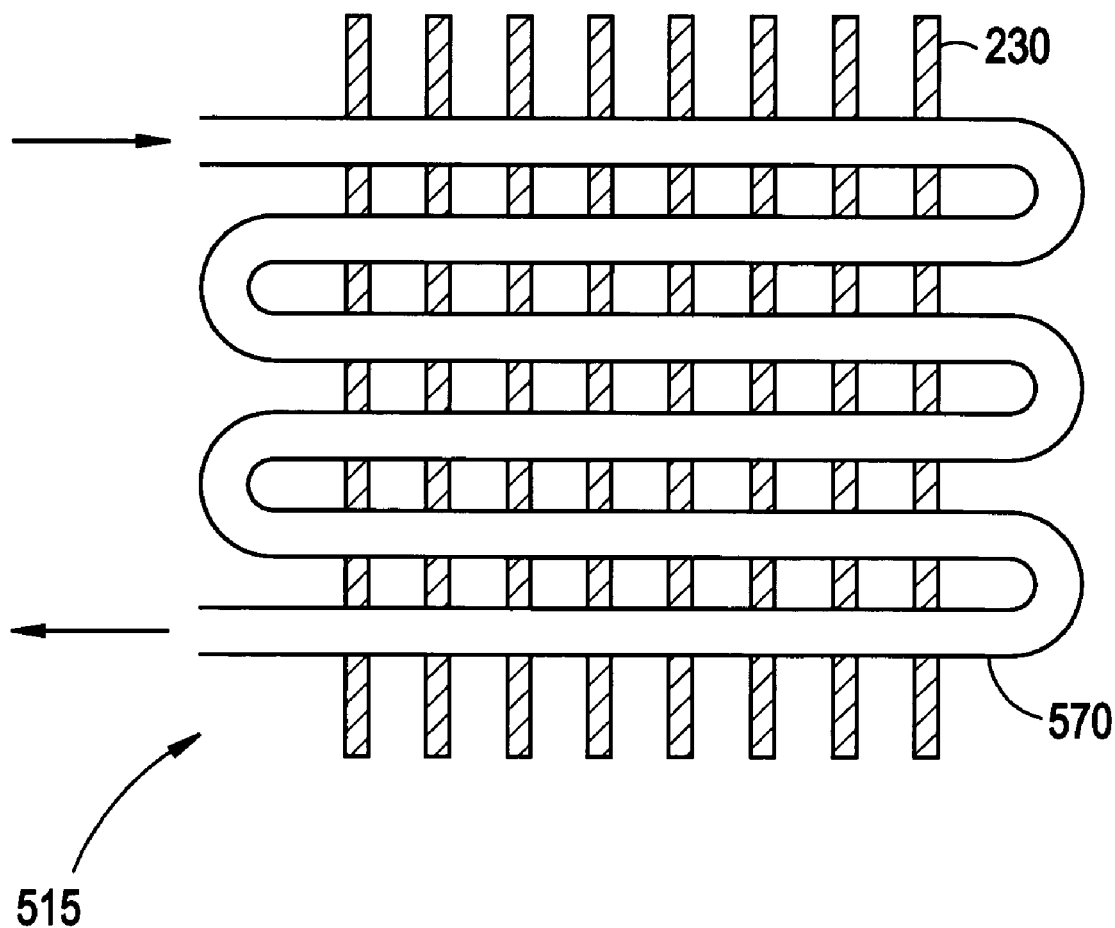
FIG. 11 depicts generally a sectional view of a condenser for use in an embodiment of the invention.

In the CLRC 525, compressor 530 compresses refrigerant gas to raise the refrigerant's temperature and pressure. Compressor 530 is coupled via supply lines, depicted generally by numeral 525, to condensor 515, which includes coils 570 (seen in FIG. 11) that allow the hot refrigerant gas to dissipate heat. The coils 570 are cooled by high flux air, generally depicted by numeral 565, generated by turbofan 550 at second turbomachine 510 flowing across condensor 515. Condensor 515 may also include a heat exchanger 230 coupled to coils 570 for improved heat transfer. Ambient air 600 following air flow path 565 passes over heat exchanger 230 of condensor 515, whereby heat is transferred to the air and the refrigerant gas is cooled. The heated air 602 is exhausted through outlet 620 of housing 560. As the refrigerant gas cools, it condenses into a refrigerant liquid at high pressure and flows into expander/evaporator 520. Expander/ evaporator 520 includes an expansion device, which is typically an expansion valve 575 such as a needle valve. Expansion valve may be controlled by a control system 580 for controlling the pressure drop of the refrigerant across the expansion valve, thereby providing controlled pressure drops within the CLRC 525 to prevent stalling of first turbomachine 505 on startup. As the refrigerant liquid flows through the expansion valve 575, the refrigerant liquid moves from a high pressure zone to a low pressure zone, which allows the refrigerant to expand and evaporate within the expander/evaporator 520, resulting in a drop in refrigerant temperature. The reduced refrigerant temperature is used to cool HPDD 220, which is discussed below in more detail. The refrigerant gas is then returned to compressor 530 via turbine 540 and optional ejector 545, where the CLRC 525 repeats. An alternative flow path for the low pressure/ low temperature refrigerant gas from turbine 540 to ejector 545 is via motor 535, depicted generally by numeral 590, which enables cooling of motor 535.

Optional ejector 545 is used to mix refrigerant at high pressure coming from compressor 530 with refrigerant at low pressure coming from turbine 540, thereby increasing the mass flow through compressor 530 to prevent compressor stall. The high pressure flow path from compressor 530 to ejector 545 is depicted generally by numeral 585. An alternative arrangement to prevent compressor stall includes a variable speed compressor and a control system (see wires 365 in FIG. 4) for controlling the variable speed compressor.

In one embodiment, expander/evaporator 520 includes a heat exchanger 230 (see FIGS. 2 and 11), which is cooled by the low temperature refrigerant. Ambient air 600 driven by second turbomachine 510 passing over expander/evaporator 520 is cooled by heat exchanger 230. The chilled air 605 on the downstream side of expander/evaporator 520 is directed out of turbomachine 500 via passages in housing 560 and directed towards HPDD 220, as shown in FIGS. 9 and 10.

In another embodiment, expander/evaporator 520 includes a cold plate 610, which is cooled by the low temperature refrigerant. Cold plate 610, which is thermally coupled to HPDD 220, cools HPDD 220 as the high temperature HPDD 220 passes heat to cold plate 610. Cold plate 610 may be located within housing 560 of turbomachine 500 as shown in FIG. 10, or alternatively located on surface 210 of turbomachinery system 200 at a distance from turbomachine 500 via supply lines 615 as depicted in FIG. 9.

In yet another embodiment, expander/evaporator 520 includes both a heat exchanger 230 and a cold plate 610, where heat exchanger 230 is located within housing 560 of turbomachine 500 and cold plate 610 is located external of housing 560 at a distance from turbomachine 500. By segmenting expander/evaporator 520 into two discrete components, one having a cold plate 610 component and a second having a heat exchanger 230 component, and sizing turbomachine 500 appropriately, cooling of HPDD 220 may be achieved by cold plate 610 and cooling of secondary components on circuit board 120 may be achieved by chilled air 605 from heat exchanger 230 being directed for that purpose. Since cooling of HPDD 220 is desired, it is preferable that CLRC 525 first delivers cold refrigerant to cold plate 610 and then to heat exchanger 230, however, this arrangement is not limiting and alternative refrigerant flow paths may be employed. It will also be appreciated that the relative location of cold plate 610 and heat exchanger 230 described herein is not meant to be limiting and that any arrangement suitable for a particular cooling task will still adhere to the teaching of the present invention.

A modular embodiment of turbomachinery system 200 is seen by now referring to both FIGS. 2 and 9, where surface 210 is segmented at line 650 into a first surface 655 and a second surface 660. In a first modular embodiment, first surface 655 provides a turbomachinery module 665 that includes a turbomachine 300, a heat exchanger 230, and a transition duct 240, as discussed above in reference to FIG. 2. In a second modular embodiment, first surface 655 provides a turbomachinery module 665 that includes a turbomachine 500, a cold plate 610, and supply lines 615, as discussed above in reference to FIG. 9. Second surface 660 represents circuit board 120, in whole or in part, that includes an HPDD 220 to be cooled. In first turbomachinery module 665 of FIG. 2, heat exchanger 230 overhangs edge 650 of first surface 655, thereby enabling heat exchanger 230 to be thermally coupled to HPDD 220 on second surface 660. Alternatively, heat exchanger 230 may be a standalone component that is first thermally coupled to HPDD 220, with first surface 655 then being fastened to second surface 660 such that transition duct 240 abuts heat exchanger 230 to function in the manner described above. In second turbomachinery module 665 of FIG. 9, cold plate 610 extends beyond edge 650 of first surface 655 via flexible supply lines 615, thereby enabling cold plate 610 to be thermally coupled to HPDD 220 on second surface 660. Alternatively, cold plate 610 may be first incorporated on or within second surface 660 and thermally coupled to HPDD 220, with first surface 655 then being fastened to second surface 660 and supply lines 615 being connected together with suitable connectors, such as plugs or soldered connections, at segmentation line 650. First and second surfaces 655, 660 are fastened together by any suitable fastening means, such as but not limited to snap-fit connectors, plug-in connectors, bridging straps fastened to each surface 655, 660 using screws or bolts, or adhesive means. Turbomachinery module 665 of either FIG. 2 or FIG. 9 is also suitable for 1U applications where dimension "D" is no greater than 1.75 inches.

Turbomachinery system 200 may include various control electronics (see wires 365 in FIG. 4 and control system 580 in FIG. 10) for controlling turbomachines 300, 500 that include such systems as, but not limited to, motors 310, 325, variable speed compressor 530, and expansion valve 575. The control electronics may be coupled to surface 210 by any suitable means, including but not limited to, surface mount technologies, adhesives, and thermal bonding (welding, soldering, hot gluing, thermoplastic melt). The control electronics may also include a soft starter for controlling the start up of turbomachinery system 200, thereby preventing power surges or stalling during start up.

Figure 12:
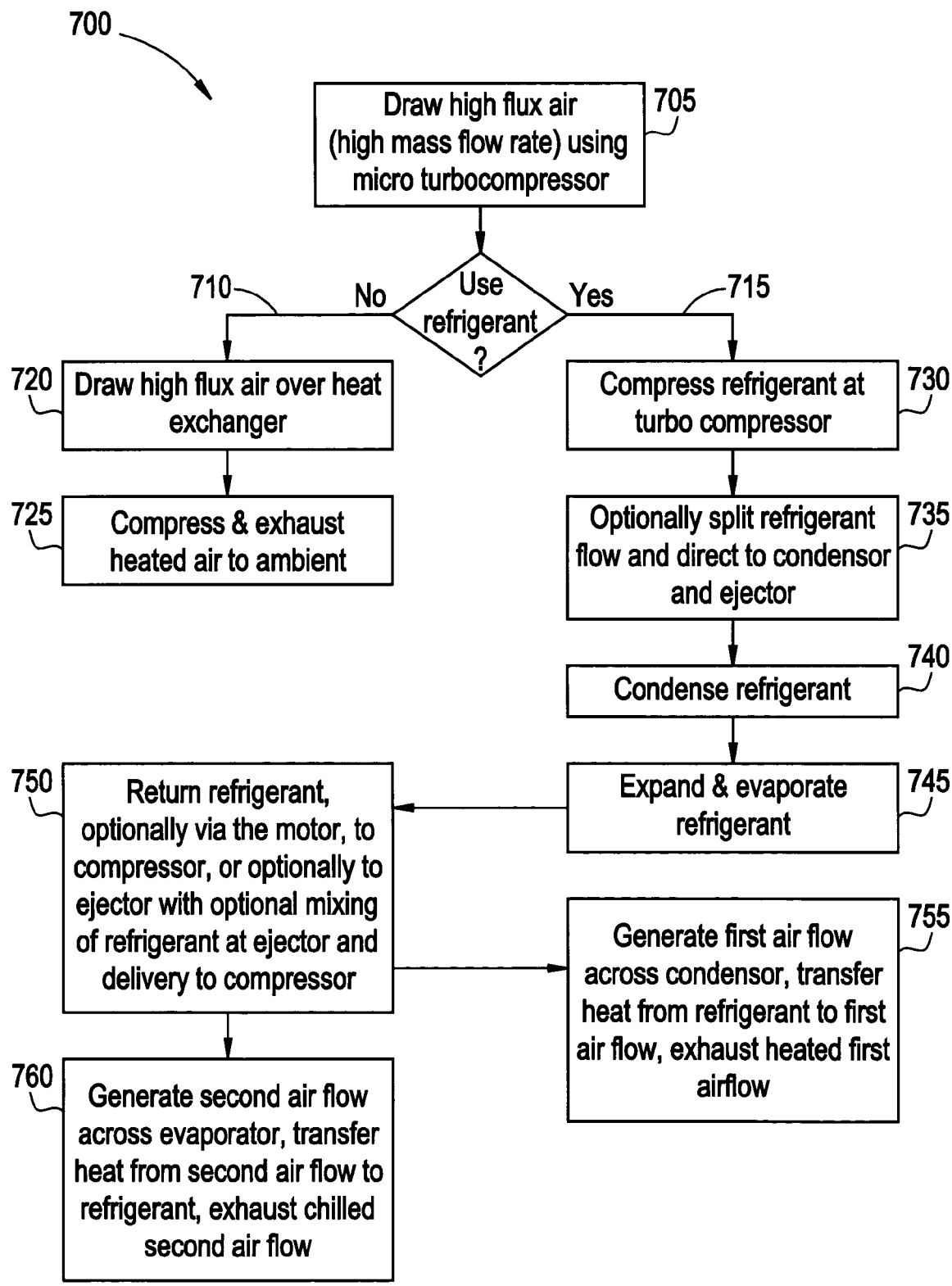
FIG. 12 depicts a process for employing an embodiment of the invention.

An embodiment of the cooling method employed by turbomachinery system 200 is depicted in FIG. 12, the cooling method being used to cool a HPDD 220, such as an integrated circuit. Referring now to FIG. 12, method 700 begins at step 705 where high flux air (high mass flow rate) is drawn into a turbomachine 300, 500 that uses a micro turbocompressor 340, 530. If the cooling method 700 uses air as the cooling medium, then path 710 is followed. If the cooling method 700 uses refrigerant as the cooling medium, then path 715 is followed.

Referring now to process path 710, the high flux air is drawn 720 over a heat exchanger 230, which is thermally coupled to HPDD 220, thereby resulting in an increase in air temperature as the air passes over heat exchanger 230 and heat is transferred from HPDD 220 to heat exchanger 230 and then to the high flux air. The high flux air from heat exchanger 230 is then compressed 725 at compressor 340 and exhausted 725 at outlet 355 of turbomachine 300.

Referring now to process path 715, a refrigerant is first compressed 730 at turbocompressor 530. Upon leaving compressor 530, the refrigerant either flows 735 to condensor 515 or is optionally split 735 into two flow paths, one path flowing to condensor 515 and the other path flowing back to ejector 545. The decision to include an optional flow path back to ejector 545 is determined by the system design and whether stalling of turbomachine 500 is a design consideration or not, the additional high pressure refrigerant from compressor 530 providing increased mass flow to compressor 530 via ejector 545. At condensor 515 the refrigerant is condensed 740 by removing heat from the refrigerant, the heat being removed by a high flux air flow discussed below. After the refrigerant condenses, it flows through expander/evaporator 520 where it expands and evaporates 745 into a low temperature/low pressure gas, the low temperature/low pressure refrigerant gas being used to cool HPDD 220 via cold plate 610, discussed above, or via high flux air flow discussed below. The low pressure refrigerant gas then returns 750 to compressor 530 to start the cycle over. The return path of the low pressure refrigerant gas to compressor 530 may be via motor 535 of turbomachine 505, whereby motor 535 is cooled. If ejector 545 is employed, the low pressure refrigerant gas returns 750 to ejector 545 where it is mixed with high pressure refrigerant gas from compressor 530 before starting the cycle over. In parallel to the refrigeration cycle, second turbomachine 510 generates 755, 760 a first high flux airflow across condensor 515, and a second high flux airflow across expander/evaporator 520. At condensor 515, which may include a heat exchanger similar to heat exchanger 230, heat is transferred 755 from the refrigerant to the first high flux airflow via the heat exchanger. The heated air is then exhausted 755 through outlet 620 of housing 560. At expander/evaporator 520, which includes coils 570 and may include heat exchanger 230, heat is transferred 760 from the second high flux air flow to the refrigerant via coils 570 and heat exchanger 230. The chilled air is then exhausted 760 to cool HPDD 220, or other low power density devices on circuit board 120, as depicted in FIG. 9.

Figure 13:
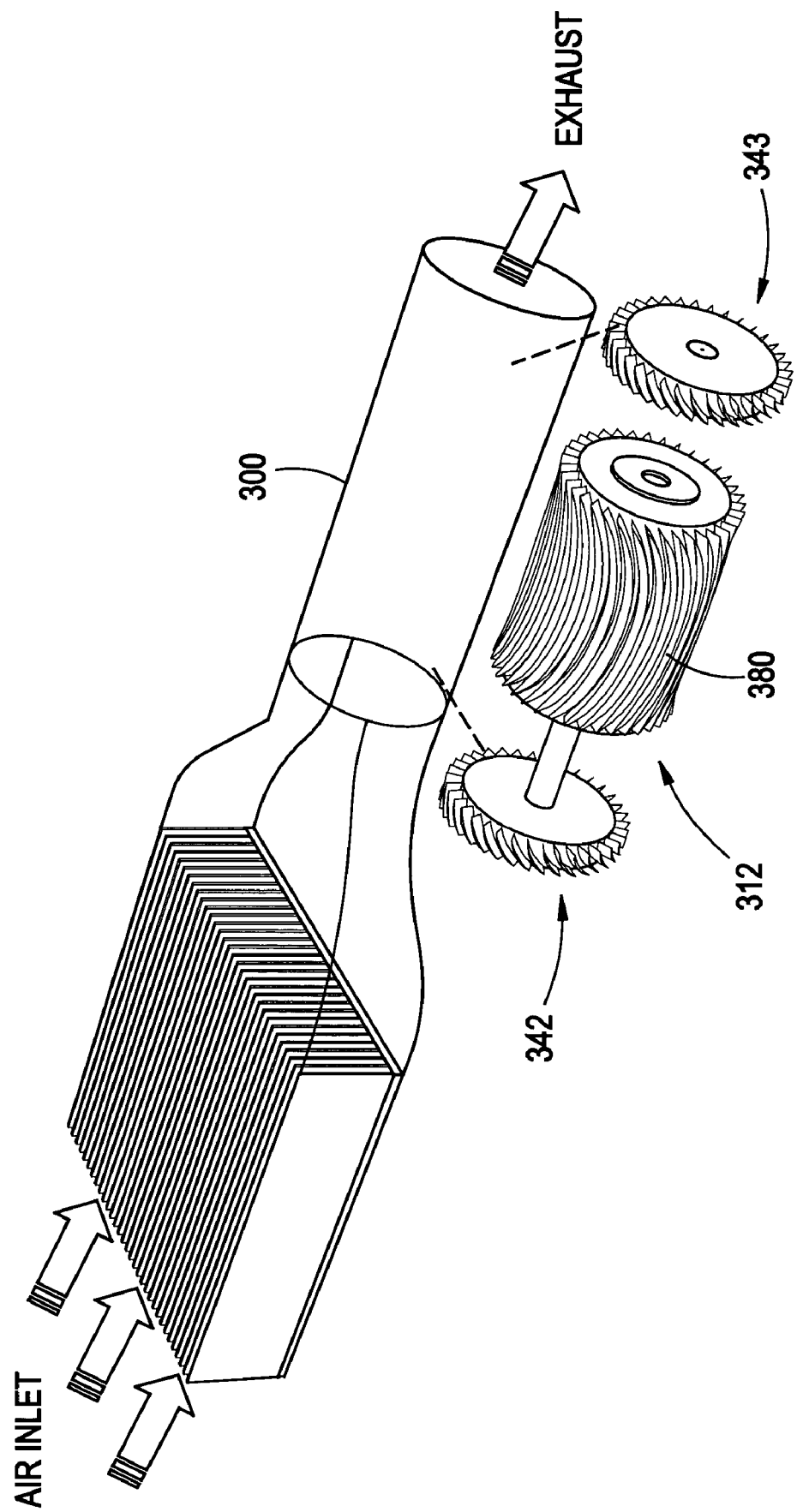
FIGS. 13 and 14 depict an embodiment of the invention having multi-stage micro compressors.
Figure 14:
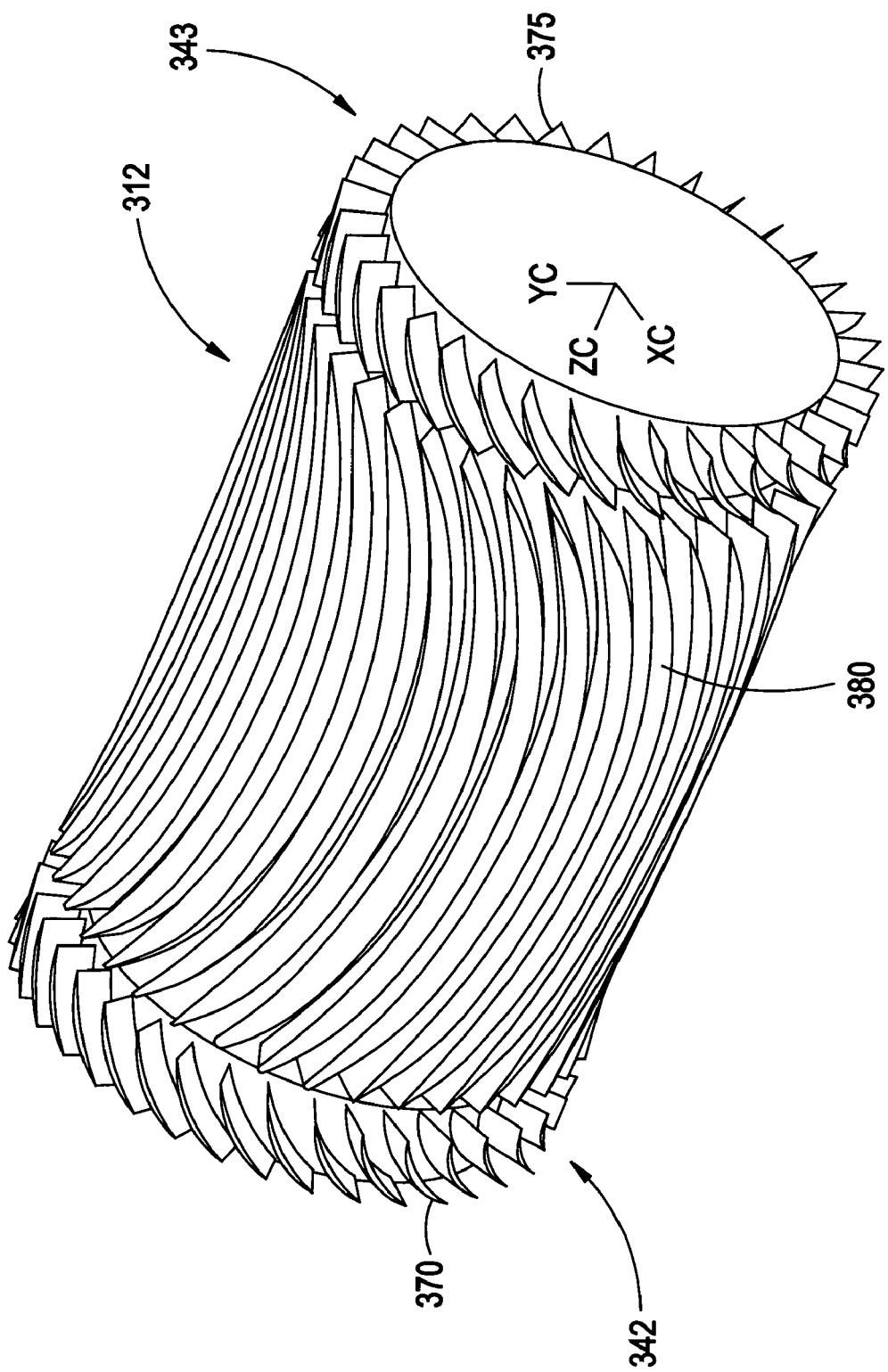

Referring now to FIGS. 13 and 14, turbomachine 300 is depicted as a micro turbocompressor, which includes a motor 312, a first stage micro compressor 342 having first stage compressor vanes 370 and disposed at one end of motor 312, and a second micro compressor 343 having second stage compressor vanes 375 and disposed at the other end of motor 312. First and second stage micro compressors 342, 343 may be constructed integral with motor 312, thereby providing a compact micro turbocompressor system. To enhance the cooling of motor 312, cooling fins 380 may be machined on the outer surface of the stator of motor 312, the cooling fins 380 extending from one end of motor 312 to the other end. First and second stage micro compressors 342, 343 are arranged with appropriate diameters and air flow profiles to drive and draw, respectively, air between cooling fins 380. Cooling fins 380 are typically nonlinear in geometry, and generally have a curvilinear profile for enhanced cooling. While FIGS. 13 and 14 depict only one motor 312 and two micro compressor 342, 343, alternative arrangements may consist of a plurality of motors, as depicted in FIG. 4, and a plurality of micro compressors.

Figure 3:
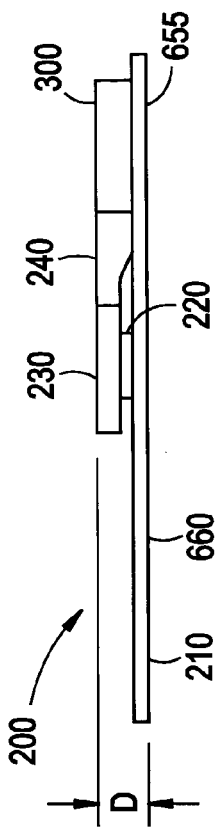
FIG. 3 depicts a side view of the system of FIG. 2.
Figure 15:
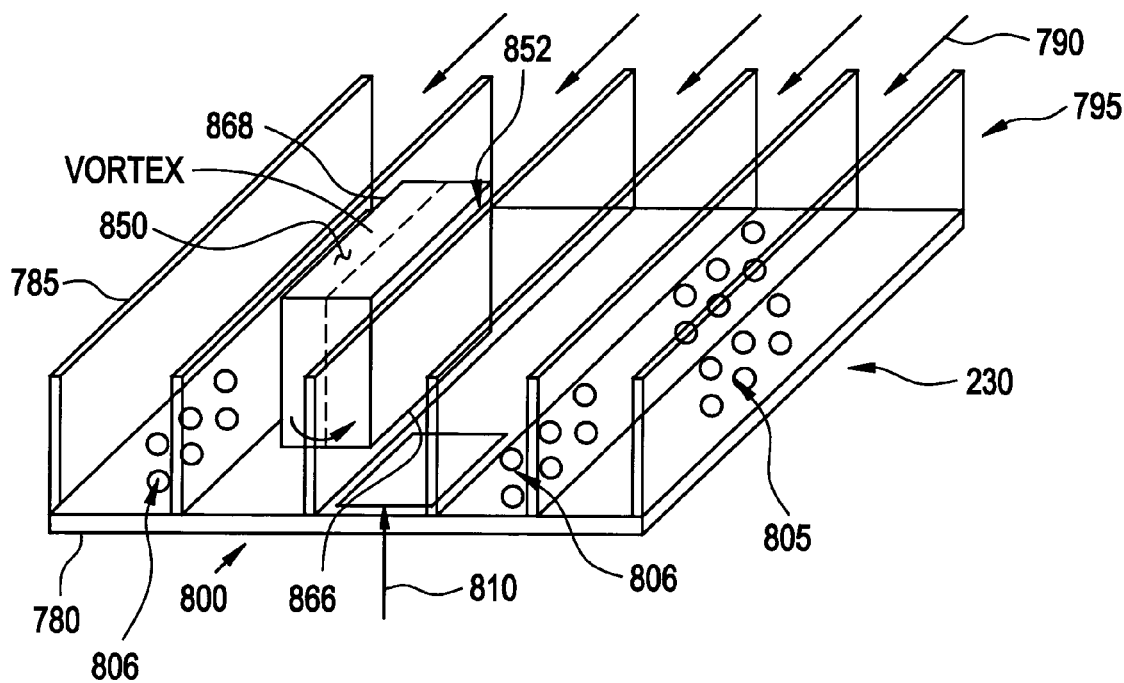
FIGS. 15 and 16 depict heat exchangers for use in an embodiment of the invention.
Figure 16:
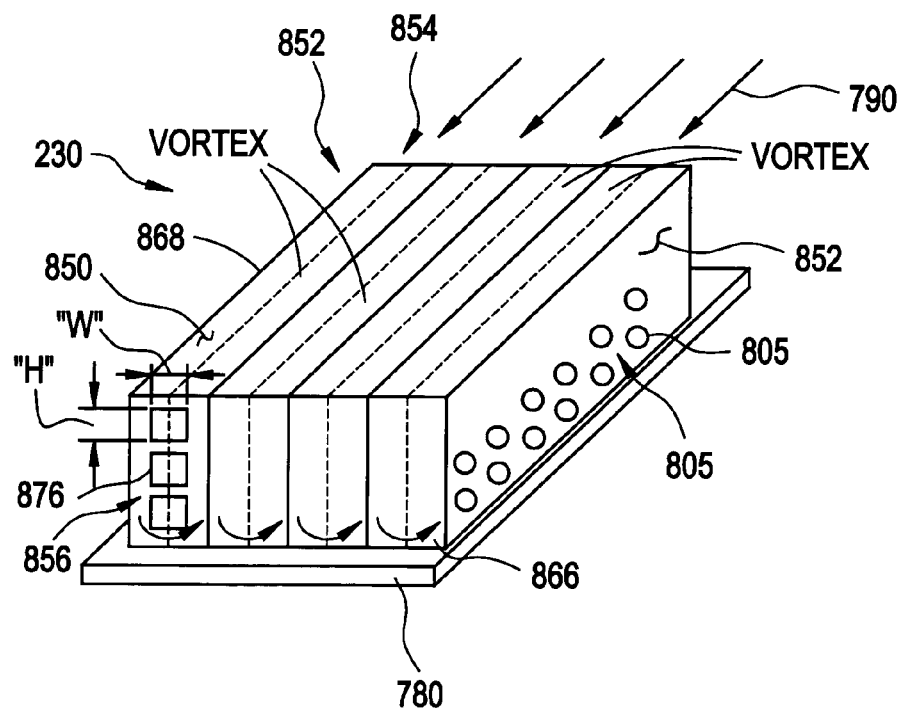
Figure 17:
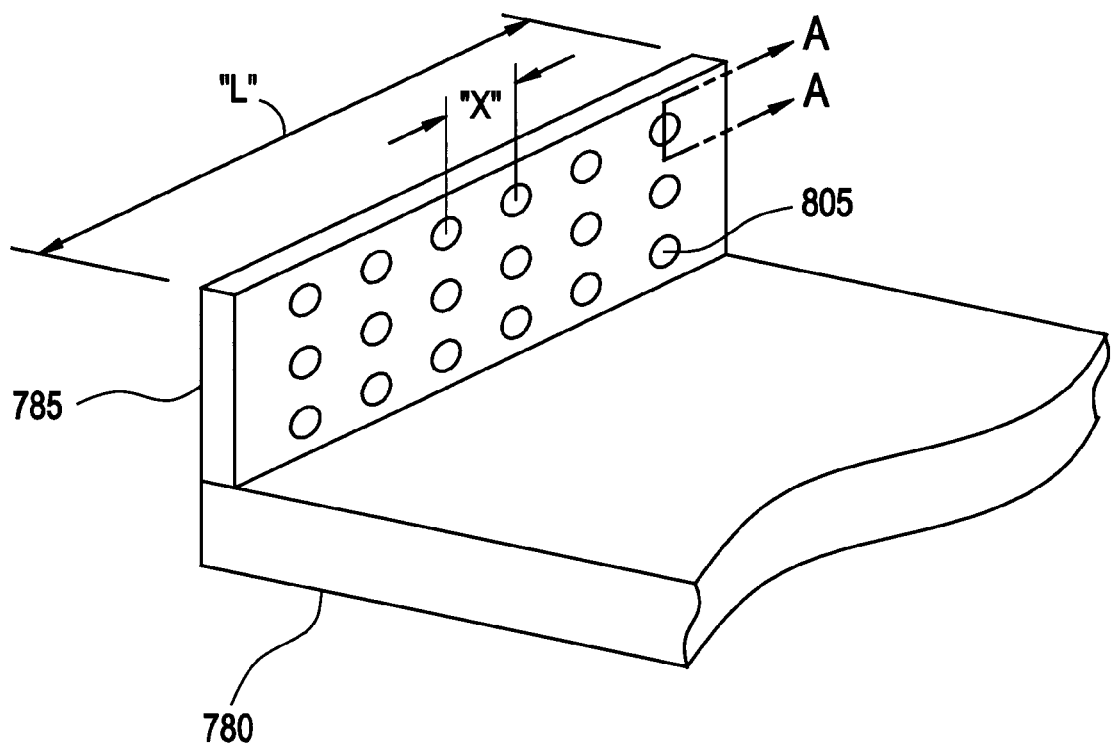
FIG. 17 depicts a detailed view of a portion of the heat exchanger of FIG. 15.

Referring now to FIGS. 15–17, a high flux/low pressure drop heat exchanger 230 is depicted having various heat exchange enhancing features. Heat exchanger 230 includes a base 780 for thermally coupling heat exchanger 230 to HPDD 220, as depicted in FIG. 3, and a plurality of parallel cooling fins 785 arranged perpendicular to base 780 for receiving air, depicted by arrows 790 and driven by turbomachine 300, at one end 795 of heat exchanger 230, the air being discharged at the opposite end 800 of heat exchanger 230.

A first heat exchange enhancing feature is provided by a plurality of concavities 805 arranged on cooling fins 785, or concavities 806 on base 780, to enhance the effectiveness of cooling fins 785, the term concavities 805, 806 referring to depressions, indentations, dimples, pits or the like, which serve to produce flow vortices enhancing the thermal mixing and heat transfer. While concavities may in an embodiment consist of through holes, the effective heat transfer compared to dimples, for example, will be diminished. The shape of the concavities 805 is typically hemispherical or an inverted and truncated conical shape. In another embodiment, the shape of the concavities 805 is any sector of a full hemisphere. In some embodiments, the concavities 805 are disposed on an entirety or a portion of the abovementioned cooling fins 785. The concavities 805 are formed on the abovementioned surfaces in a pattern that serves to enhance the heat transfer from cooling fins 785. The manner of operation of concavities 805, 806 is described generally as an increase in the interaction between the air stream and the cooling fins 785, thereby resulting in improved heat transfer as compared to cooling fins 785 without concavities 805. In addition, the thermal interaction between the air stream and each respective concavity is increased due to an increase in surface area with respect to a surface without concavities, the increased surface area being a result of the shape of each respective cavity. As such, the air flow interacts with the increased surface area thereby enhancing the removal of heat energy from the cooling fins 785.

The depth "Y" (see FIGS. 17, 18) for a given one of the concavities 805 typically, but not necessarily, remains constant through the length "L" of a cooling fin 785. The depth "Y" (see FIGS. 17, 18) is generally in the range between about 0.10 to about 0.50 times the concavity surface diameter "d". In addition, the depth "Y" of the concavities 805 is in the range between about 0.002 inches to about 0.125 inches. The center-to-center spacing "X" (see FIGS. 17, 18) of the concavities 805 is generally in the range between about 1.1 to about 2 times the surface diameter "d" of the concavities 805. In one embodiment, the concavities 805 are typically formed by using a pulse electrochemical machining (PECM) process. In an alternative embodiment, the concavities 805 are typically formed by using an electro-discharge machining (EDM) process.

A second heat exchange enhancing feature is provided by localized cooling region 810 disposed on base 780, which may be provided by discrete roughness elements adhered (using braze or adhesion for example) to base 780 that locally increase the surface area or may be provided using a mechanical process (etching, machining, pulsed electro-discharge machining, or masked electrodes for example) that increases the surface texture (i.e., roughness), for enhanced surface area heat transfer. Localized cooling regions 810 may be used at predefined locations on base 780 where base 780 abuts discrete circuit components that generate excessive heat and develop hot spots on base 780. While only a few concavities 805 are depicted on cooling fins 785 in FIG. 15, and only one localized cooling region 810 is depicted on base 780 in FIG. 15, it will be appreciated that the illustration depicted in FIG. 15 is exemplary only and that any number of concavities 805 in any arrangement or any number of localized cooling regions 810 at any location on base 780 fall within the scope of this invention.

A third heat exchange enhancing feature depicted in FIGS. 15–17 is a vortex air flow through and across heat exchanger 230, which utilizes swirl flow techniques to more effectively transfer heat from base and cooling fins 780, 785 to ambient, the base being thermally coupled to HPDD 220. FIG. 15 depicts a vortex chamber 850, to be discussed in more detail below in reference to FIG. 19, disposed between cooling fins 785 and thermally coupled to base 780. FIG. 16 depicts a plurality of vortex chambers 850 arranged parallel to each other and each thermally coupled to base 780. In FIG. 16, the sides 852 of vortex chambers 850 and cooling fins 785 are integral with one another, the sides 852 acting as cooling fins 785. The sides 852 of vortex chamber 850 may include concavities 805 to enhance heat transfer as discussed above. Air flow 790 enters vortex chamber 850 at a first end 854 and is discharged at a second end 856 of vortex chamber 850. Vortex chamber 850 may be machined, cast or molded out of any material having suitable heat transfer properties, such as for example aluminum, zinc alloy, copper alloy or molded plastic having heat transfer additives.

Figure 19:
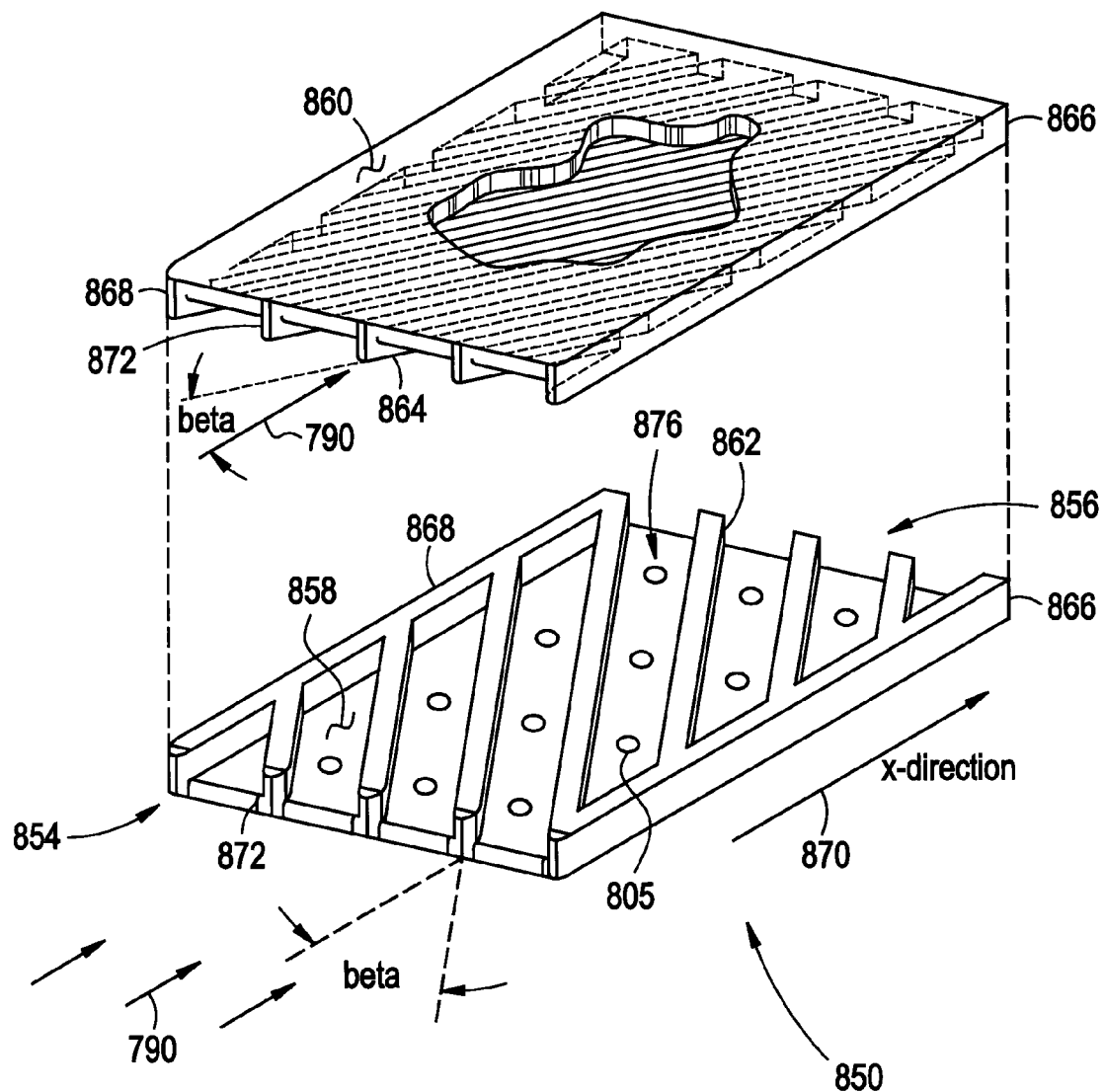
FIGS. 19 and 20 depict exploded isometric views of a vortex chamber for use in an embodiment of the invention.

Referring now to FIG. 19, an exploded isometric view of an embodiment of vortex chamber 850 is depicted having first and second ends 854, 856, first and second sides 858, 860, internal ribs 862, 864 on first and second sides 858, 860, respectively, first and second edges 866, 868, and concavities 805, which are shown only on first side 858, but it will be appreciated that concavities 805 may also be on second side 860. Air flow 790 is received at first end 854 and discharged at second end 856. Internal ribs 862 are arranged oblique, that is, diverging from a given straight line, to the impinging air flow 790 (x-direction 870), and are depicted at an angle of positive-beta with respect to x-direction 870. Internal ribs 864 are also arranged oblique to the x-direction 870, but at an angle of negative-beta with respect to x-direction 870. The included angle between ribs 862 and 864 is then two-times-beta (2beta). It will be appreciated that while internal ribs 862, 864 are typically straight ribs at the positive and negative beta angles, respectively, curved ribs may also be employed where only a portion of internal ribs 862, 864 are arranged at the positive and negative beta angles, respectively. It will also be appreciated that internal ribs 862, 864 may not necessarily be at the same positive and negative beta angles, respectively. The primary function of ribs 862,864 is to redirect the air flow at the turning regions 815 from one set of channels (between ribs 862, 864) to the other, and in so doing produces enhanced heat transfer. To accomplish this, the geometry is arranged such that the channels between ribs 862, 864 overlap with open areas in the turning regions 815 (see FIG. 20).

Turning regions 815 serve to locally enhance the heat transfer from base 780 of heat exchanger 230 compared to conventional heat exchangers having no turning regions. It will be appreciated that the number of turning regions 815 for enhancing heat transfer is left to the artisan to determine based upon predetermined design requirements, for example, heat transfer rate and thermal gradient uniformity dependent on location of HPDD's 220 thermally coupled to base 780. Also left to the artisan is the overall width and length of turning regions 815 at first edges 866 (and at second edges 868, although not depicted) of first and second sides 858, 860, as well as the channel dimensions and also the rib 862, 864 dimensions and shaping.

In the assembled state, first and second sides 858, 860 abut each other such that internal ribs 862, 864 are proximate each other. First and second sides 858, 860 may be coupled using known means, such as fasteners, mechanical or snap fit, or thermal or chemical bonding for example. Alternatively, positioning of first and second sides 858, 860 in heat exchanger 230 may be retained by offsets (not shown) on base 780, cooling fins 785, or both. First end 854 of first and second sides 858, 860 may include rounded edges 872 to reduce entry pressure losses, which reduces noise and improves air flow for less pressure drop. The ends of internal ribs 862, 864 may or may not be aligned, depending on the desired cooling characteristics of heat exchanger 230.

As the air flow 790 impinges first end 854, it is confronted with internal ribs 862, 864, having opposite oblique angles. The air flow influenced by internal ribs 862 is directed in a positive-beta direction, while the air flow influenced by internal ribs 864 is directed in a negative-beta direction. The transition of air from first side 858 to second side 860, and vice versa, causes the air flow within vortex chamber 850 to change direction, thereby creating a vortex flow.

Figure 20:
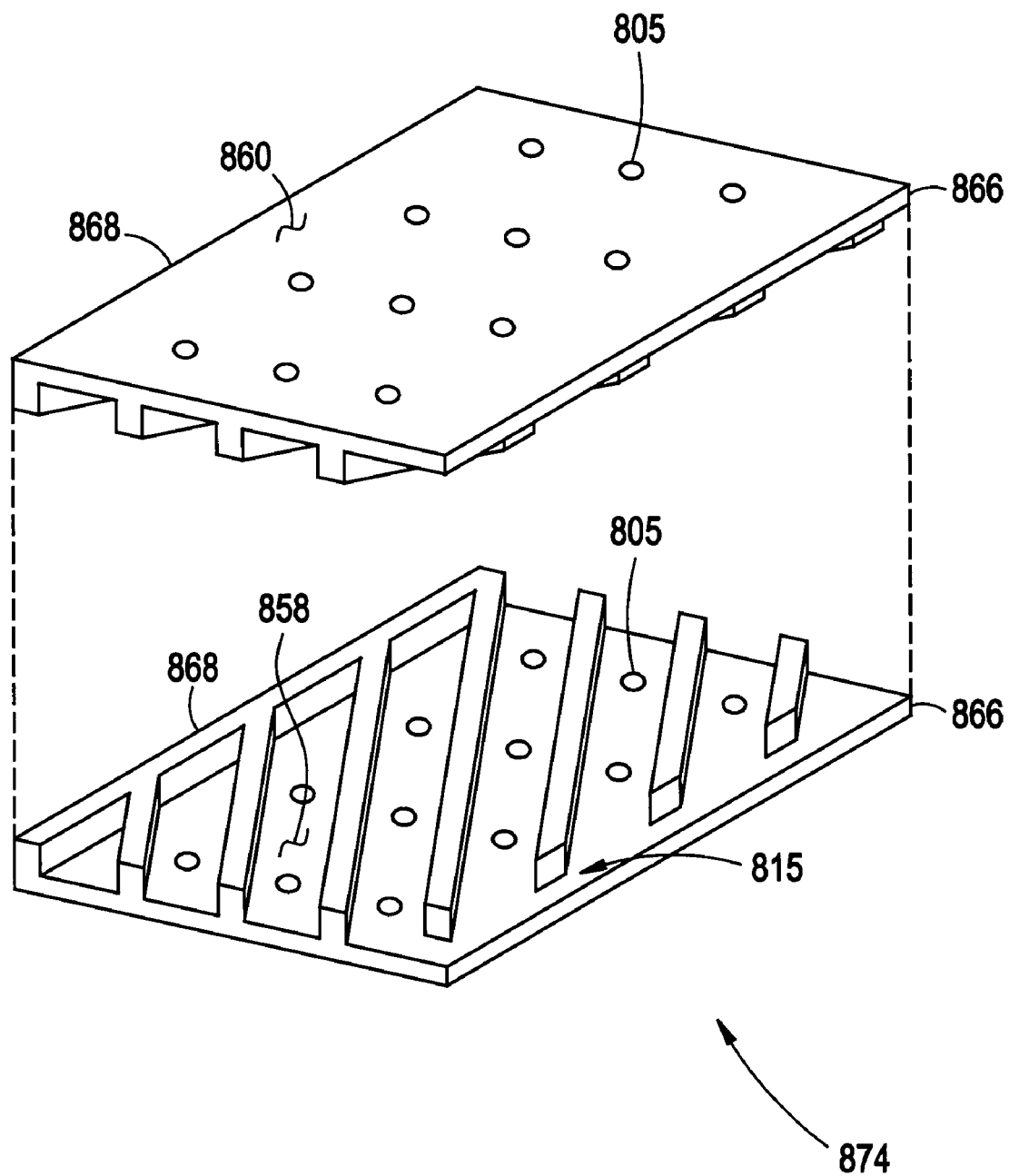

Referring now to FIG. 20, an alternative embodiment of vortex chamber 874 is depicted having first edge 866 open while second edge 868 remains closed. In the assembled state, first edge 866 is arranged proximate base 780, while second edge 868 faces away from base 780. In the arrangement of FIG. 20, vortex air flow through vortex chamber 874 is permitted to impinge base 780, thereby enhancing the heat transfer from base 780 to ambient. Vortex chamber 874 also depicts concavities 805 on second side 860, as discussed above.

Figure 18:
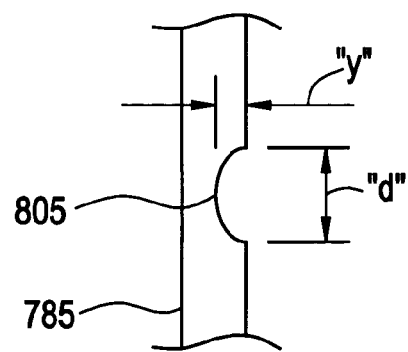
FIG. 18 depicts a further detailed view of the detailed view of FIG. 17.
Figure 21:
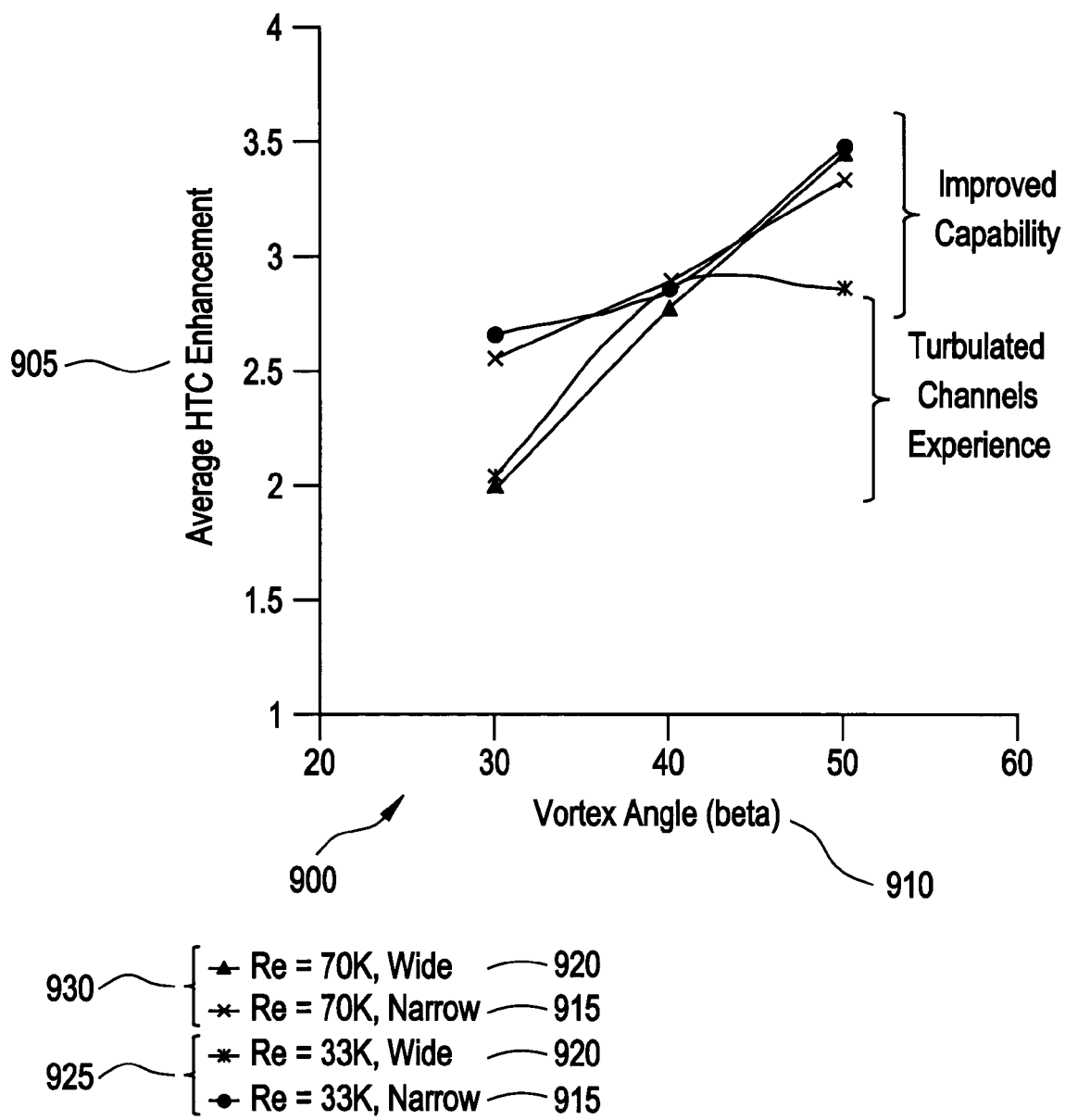
FIG. 21 depicts a graphical illustration of the average heat transfer coefficient enhancement as a function of vortex angle in accordance with an embodiment of the invention.

Vortex chambers 850, 874 depicted in FIGS. 17 and 18 include internal ribs 862, 864 having positive and negative beta angles, respectively, which may vary from a value equal to or greater than about 15 degrees to a value equal to or less than about 60 degrees, as best seen by now referring to the graph 900 depicted in FIG. 21. A beta angle that ranges from about 15 degrees to about 60 degrees will result in first side internal ribs 862 being disposed at an angle in the range between about 30 degrees and about 120 degrees with respect to the second side internal ribs 864. The beta angle may vary somewhat from the stated dimensions to accommodate tolerances without detracting from the scope of the invention. Graph 900 illustrates the relationship between the average heat transfer coefficient (HTC) enhancement 905 and the vortex angle (beta) 910, for narrow 915 and wide 920 vortex channels and for different Reynolds numbers (Re equal to 33,000 (numeral 925) and 77,000 (numeral 930)). As can be seen, an increase in the beta angle 910 generally results in an increase in average HTC enhancement 905. However, in a wide 920 vortex chamber at Re=33,000 (925), turbulent flow was experienced. In narrow 915 vortex chambers or where Re=77,000 (930), improved average HTC enhancement 905 was consistently experienced as the beta angle 910 increased. Narrow 915 vortex chambers are preferred over wide 920 vortex chambers since the narrow chambers adapt well to heat sink geometry and size where many cooling fins are employed. The use of vortex chambers (narrow and wide) having a vortex beta angle of equal to or greater than about 30 degrees and equal to or less than about 50 degrees was found to enhance the average HTC between 2–3.5 times as compared to the same heat exchanger without a vortex chamber. A preferred beta angle is about 45 degrees. A beta angle of greater than about 45 degrees, such as about 50 degrees for example, may improve the average heat transfer coefficient, as seen in FIG. 21, but the vortex chamber 850 will experience a greater pressure loss, thereby establishing a design tradeoff for the artisan. For example, at large air flow rates on the order of 720 lbs/hr, an embodiment of heat exchanger 230 with a vortex chamber 850 may produce a 10% pressure drop. Thus, in order to offset the pressure drop due to a flow rate of 720 lbs/hr, it may be necessary to reduce the beta angle in vortex chamber 850.

An embodiment of vortex chamber 850 provides each side 858, 860 with at least three individual angled flow passages 876 between ribs 862, 864, but could have as many as ten passages, all of which will turn at the edges 866, 868 to redirect the flow to the other wall. It will be appreciated that while turning regions 815 depicted in FIG. 20 are shown only at first edge 866, turning regions 815 may also be applied at second edge 868. The preferred height-to-width ("H" and "W" in FIG. 16) aspect ratio of each individual passage 876 is 1.0, but the range of such aspect ratios can be from 0.5 to 2. The size of each passage 876 is therefore commensurate with the number of channels in vortex chamber 850, the number of cooling fins 785 (separating walls of the vortex chambers), and the overall dimension of the entire heat exchanger 230. By way of example and not limitation, a heat exchanger 230 having 5 cooling plates 785 could house 4 vortex chambers 850, each chamber being composed of two opposing side walls 858, 860 having flow passages 876. If the distance between cooling fins 785 is 1-inch, then each flow passage 876 would be about 0.5 inches in height. If the overall heat exchanger 230 is 1.75 inches high and the number of flow passages 876 is 4, then each passage width would be about 0.4 inches at its inlet plane. If the passage angle (beta) is about 30 degrees, then the passage width seen by the flow would be about 0.35 inches, making the passage aspect ratio about 1.4.

Figure 22:
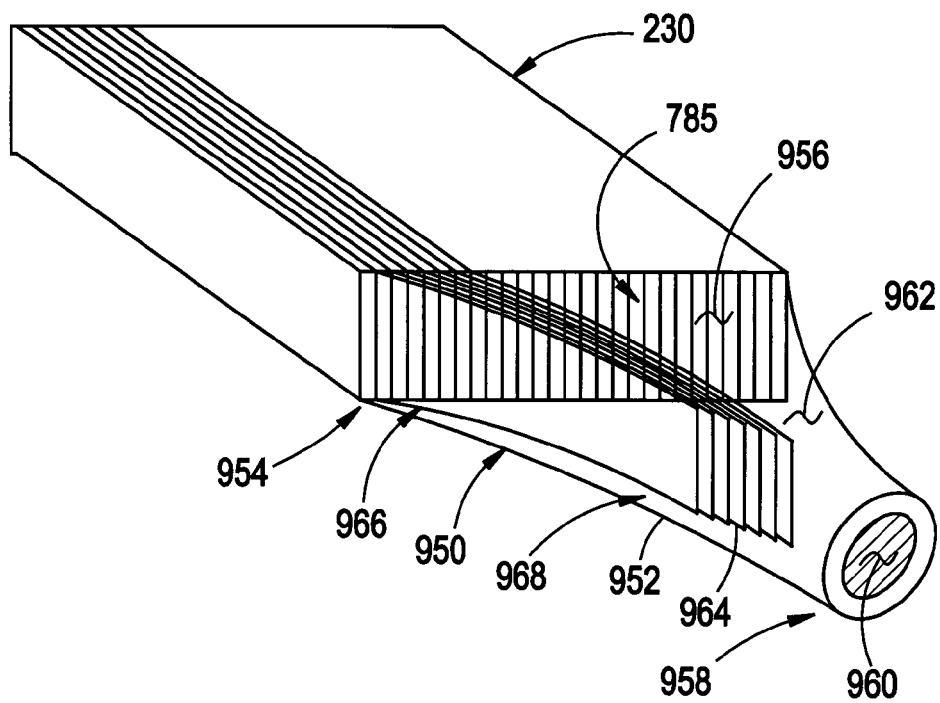
FIG. 22 depicts an isometric view of a heat exchanger and transition duct for use in an embodiment of the invention.
Figure 23:
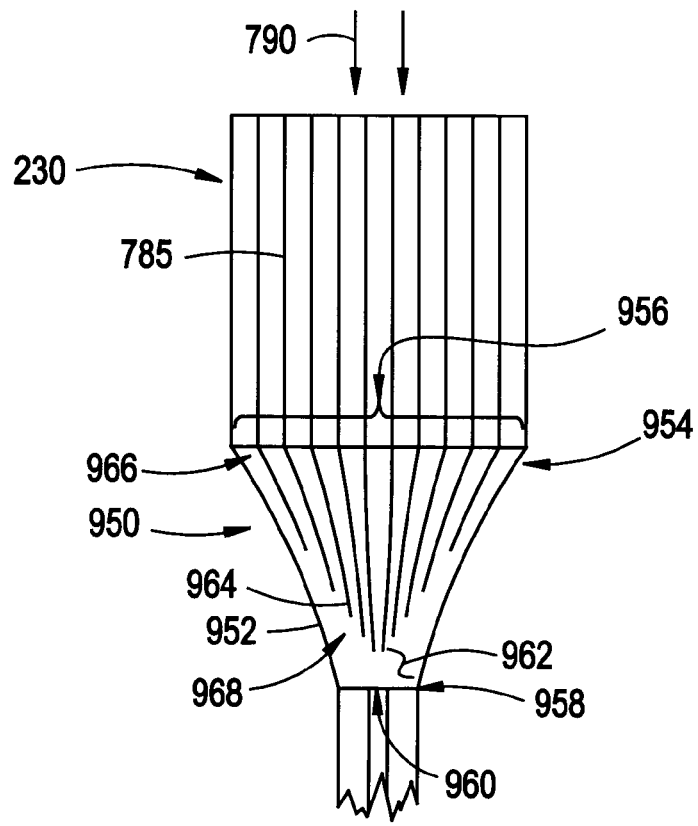
FIG. 23 depicts a plan view of the heat exchanger and transition duct of FIG. 22.

Referring now to FIGS. 22 and 23, an alternative embodiment to transition ducts 240, 415 is depicted. While the alternative embodiment transition duct 950 more closely resembles transition duct 240, it will be appreciated that the same principles hereinafter disclosed may also apply to transition duct 415.

Transition duct 950 includes a duct housing 952 having a first end 954 with a first flow area 956 for receiving driven air from heat exchanger 230 having a plurality of cooling fins 785, and a second end 958 with a second flow area 960 for discharging the driven air to turbomachine 300 (shown in FIGS. 2–4). An example of a first flow area 956 is 2.75 square-inches, the first flow area 956 being less than the projected area of 4 square-inches to account for the thickness of cooling fins 785. An example of a second flow area 960 is 1 square-inch. Other flow areas may be employed while still being suitable for 1U applications. Internal to duct housing 952 is a cavity 962 that transitions from a geometry having first flow area 956 to a geometry having second flow area 960. Within cavity 962 is a plurality of flow control fins 964 for managing the change in flow area from first flow area 956 to second flow area 960. Flow control fins 964 have first ends 966 arranged proximate cooling fins 956 of heat exchanger 230, and second ends 968 extending toward second end 958 of transition duct 950. While some flow control fins 964 may extend all the way to second end 958, it is preferable that at least some flow control fins 964 do not extend all the way to second end 958, which produces less flow constriction and less pressure drop across transition duct 950. The number of flow control fins 964 in transition duct 950 may be equal to or less than the number of cooling fins 785 on heat exchanger 230, the actual number of flow control fins 964 being determined by the desired heat transfer characteristics and the desired pressure drop characteristics of turbomachinery system 200.

As the high flux air flow 790 is received at first end 954 of transition duct 950 it is segmented into separate flow channels by first ends 966 of flow control fins 964. The segmented air flow is then funneled from first flow area 956 toward second flow area 960 where it is joined by adjacent air flows in adjacent flow channels at second ends 968 of flow control fins 964. The recombined air flow is then discharged at second end 958 of transition duct 950 for entry into turbomachine 300.

Figure 24:
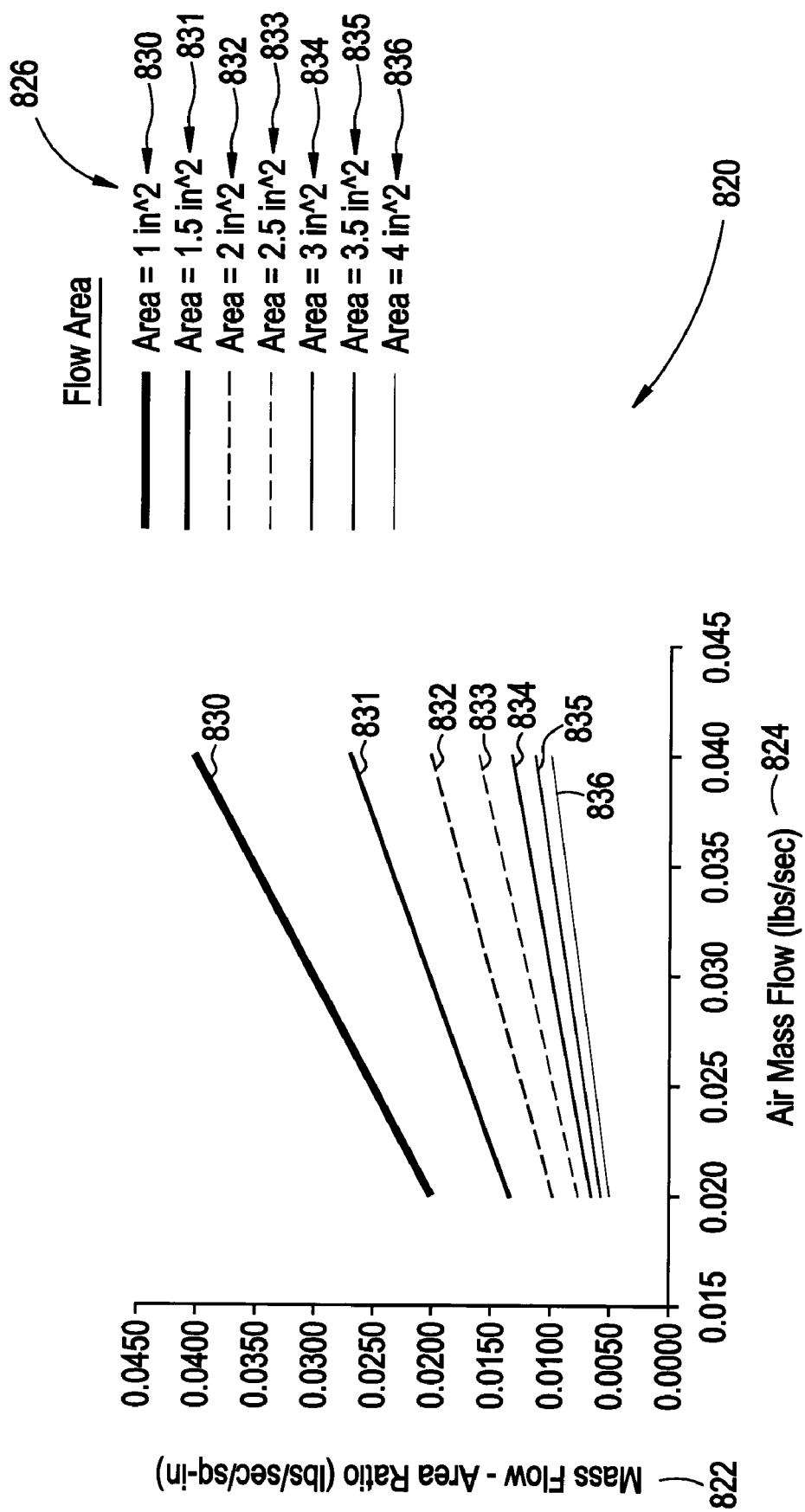
FIG. 24 depicts a graphical illustration of mass-flow-rate-to-flow-area ratio as a function of air mass flow rate for more than one embodiment of the invention.

In an, exemplary embodiment, an air mass flow rate driven by turbomachine 300 through heat exchanger 230 is on the order of 150–360 pounds-per-hour (lbs/hr), and a flow area through heat exchanger 230 is 2.75 square inches (sq-in) (discussed above), thereby resulting in a mass-flow-to-flow-area ratio of between 54.5 lbs/hr/sq-in and 130.9 lbs/hr/sq-in. In another exemplary embodiment, the mass-flow-to-flow-area ratio is between 54.5 lbs/hr/sq-in (as discussed above) and 90.9 lbs/hr/sq-in (250 lbs/hr air mass flow rate through 2.75 sq-in flow area). The exemplary mass-flow-to-flow-area ratios may be applicable with any of the aforementioned transition ducts 240, 415, 950. It will be appreciated that the flow area of 2.75 sq-in discussed above is for example only and is not intended to be limiting in any manner, as is best seen by now referring to FIG. 24. Graph 820 in FIG. 24 illustrates the mass-flow-to-flow-area ratio (mass flow-area ratio) 822, in units of lbs/sec/sq-in, as a function of air mass flow 824, in units of lbs/sec, for different flow areas 826, in units of sq-in (in^2), ranging from 1 sq-in to 4 sq-in 830–836. As shown, the mass-flow-to-flow-area ratio ranges from 0.005 lbs/sec/sq-in (18 lbs/hr/sq-in) at a flow area of 4 sq-in to 0.04 lbs/sec/sq-in (144 lbs/hr/sq-in) at a flow area of 1 sq-in. Thus, the range of mass-flow-to-flow-area ratios applicable to an embodiment of the invention is illustrated to be from 18–144 lbs/hr/sq-in.

Figure 25:
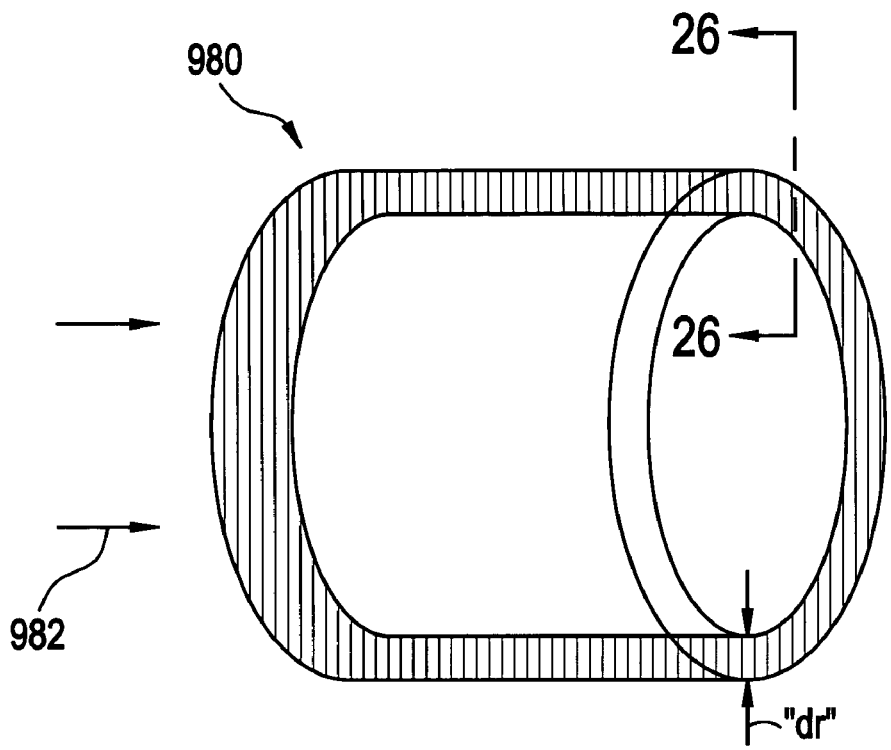
FIG. 25 depicts a portion of a flow duct for use in an embodiment of the invention.
Figure 26:
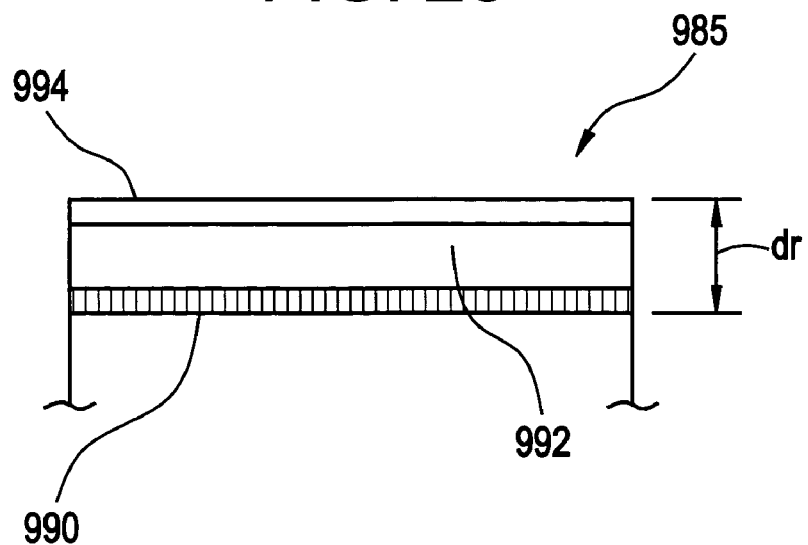
FIG. 26 depicts a cross-sectional view of the wall thickness of the flow duct of FIG. 25.

In an embodiment of the invention, the inner surfaces of transition ducts 240, 415, 950 and exhaust ducts, such as outlet 355 and entrainment nozzle 435, or the exposed surfaces of cooling fins 785, may be treated with an acoustic absorbing material to provide an acoustical damping characteristic, as depicted in FIG. 25. While FIG. 25 depicts a portion of a flow duct 980, it will be appreciated that the teachings relating to FIG. 25 are equally applicable to other surfaces, such as the cooling fins of a heat exchanger for example, where acoustical damping may also be desired. Flow duct 980 is depicted having a wall thickness "dr", which is shown as a wall section 985 in the cross-sectional view of FIG. 26. Wall section 985 is composed of an inner wall 990, a bulk absorber 992, and an outer wall 994, bulk absorber 992 being sandwiched between inner and outer walls 990, 994. Outer wall 994 is structural in function and is typically composed of a solid material such as metal, inner wall 990 is a porous material such as a ceramic or a sintered metal having a porosity of about 20% to about 60% for example, and bulk absorber 992 is composed of an acoustic damping material such as poly-paraphenylene terephthalamide (Kevlar® from DuPont) or fiberglass for example. Alternatively, bulk absorber 992 may be composed of a honeycomb structure having a cell size tuned for absorbing specific frequencies. As the air flow 982, which may include a turbulent component, passes through flow duct 980 and across the surface of inner wall 990, it generates acoustical waves that impinge upon the porous surface of inner wall 990. While a portion of these acoustical waves may reflected back, a portion of them pass through the porous surface of inner wall 990 and are absorbed by bulk absorber 992, thereby resulting in reduced operational noise of turbomachinery system 200.

Figure 27:
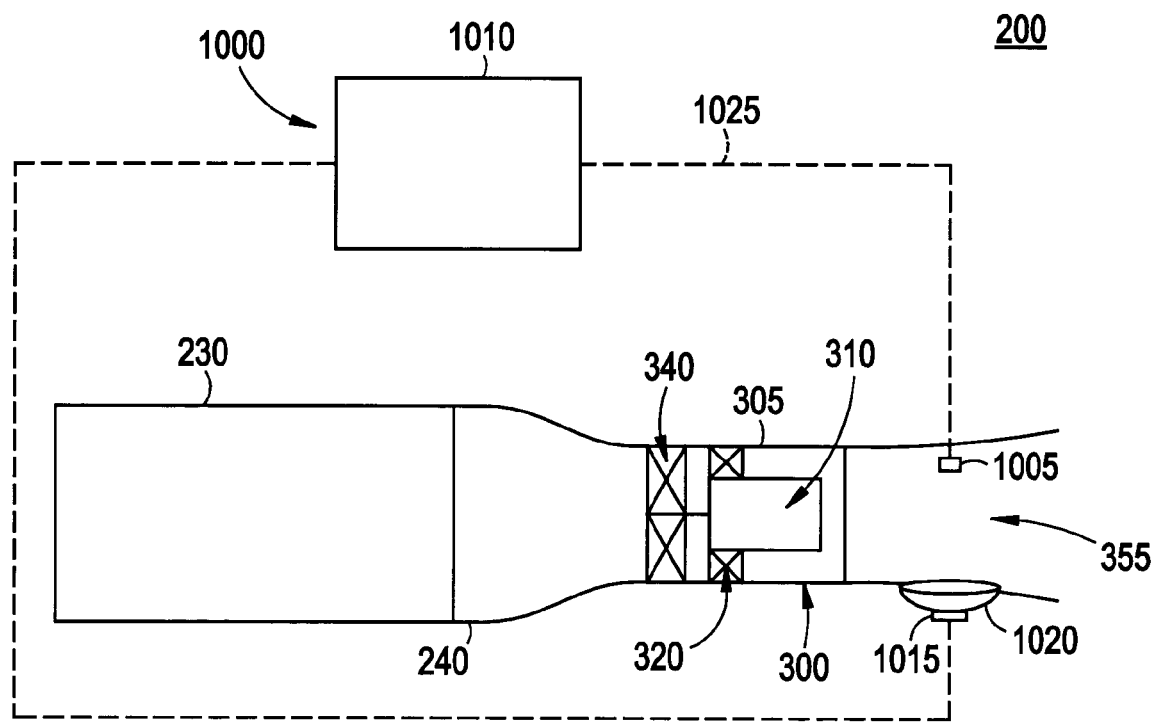
FIG. 27 depicts a turbomachinery system similar to that of FIG. 2 employing a control circuit in accordance with an alternative embodiment of the invention.
Figure 28:
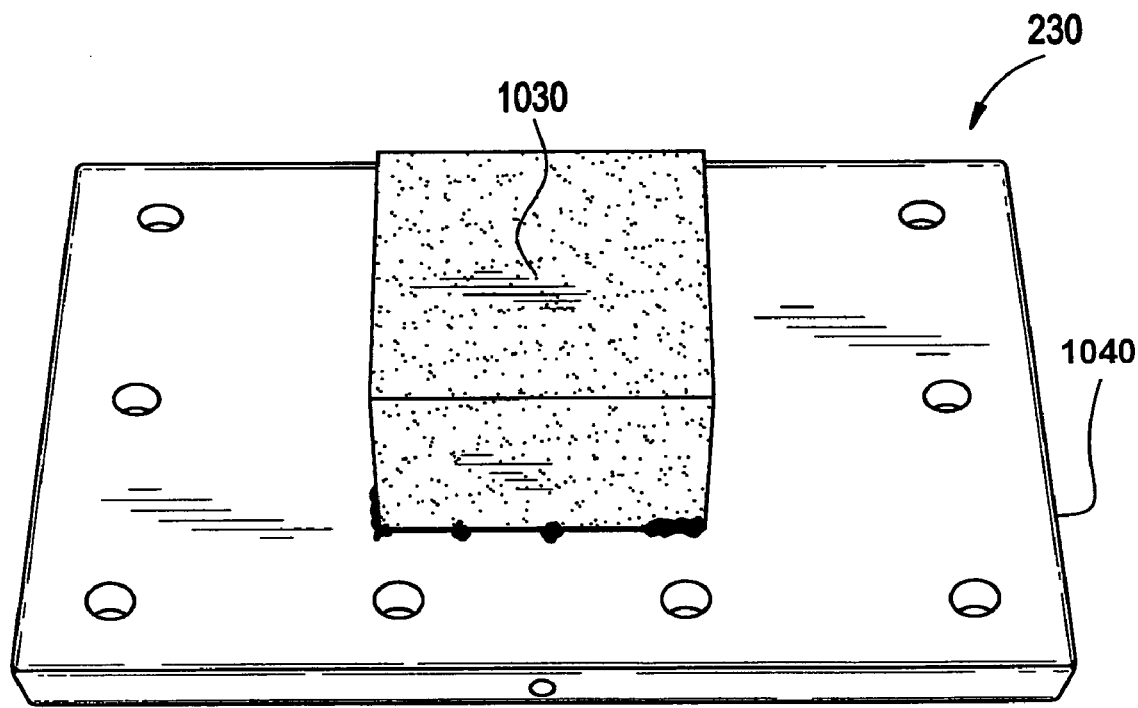
FIG. 28 depicts an alternative heat exchanger for use in an embodiment of the invention.
Figure 29:
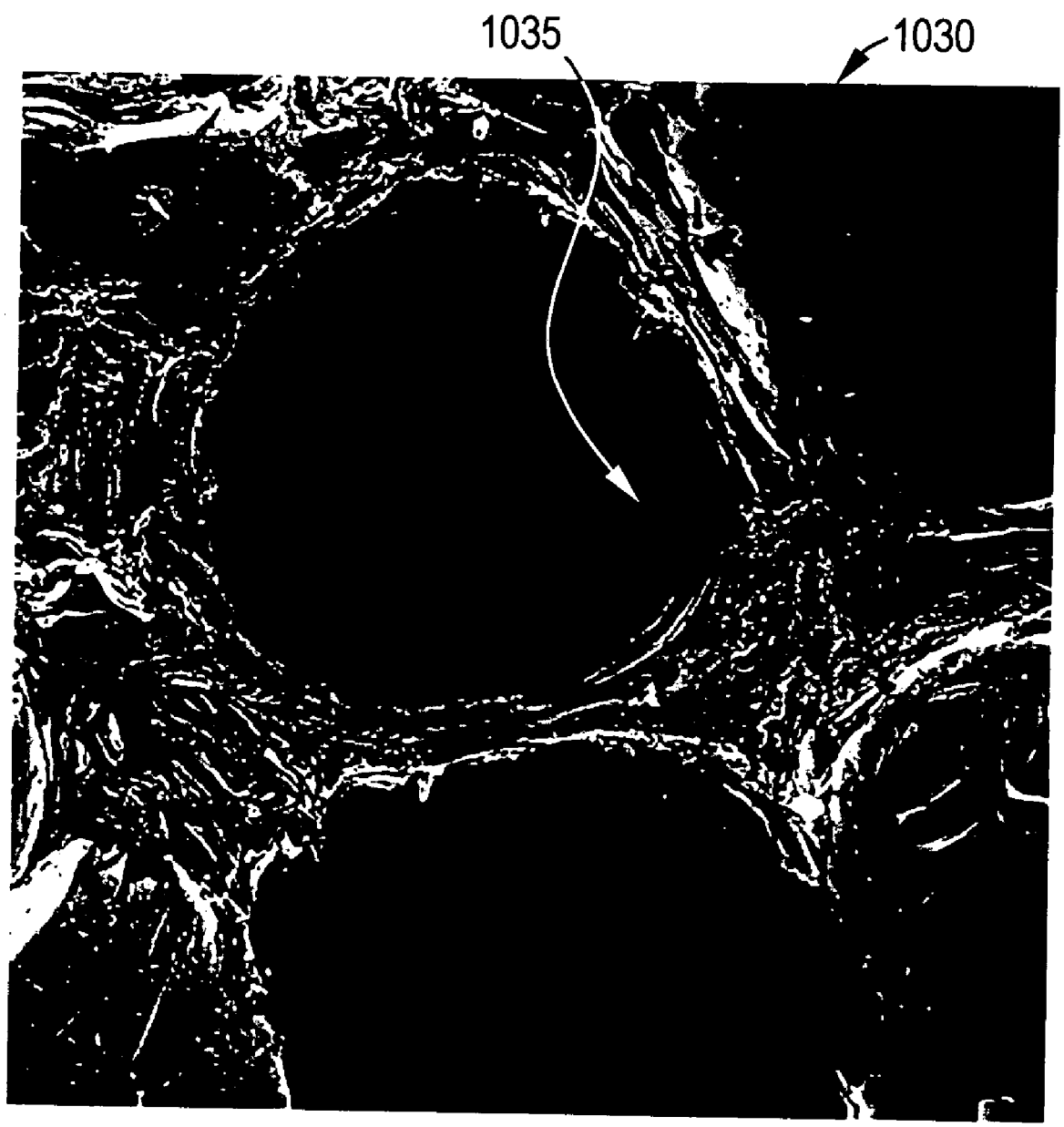
FIG. 29 depicts a magnified cross section view of the heat exchanger of FIG. 28.

In an alternative embodiment also suitable for 1U applications, and referring now to FIG. 27, the operational noise of turbomachinery system 200 may be reduced by the use of an active noise control system 1000, which includes an audio sensor 1005, such as a microphone for example, a control circuit 1010, and a noise generating device 1015, such as an audio speaker for example. An exemplary noise generating device 1015, hereinafter referred to as audio speaker, may include an air mover 1020, such as a speaker cone for example, constructed from plastic, fiber, paper, or metallic foil, for example. While FIG. 27 depicts turbomachinery system 200 having a heat sink 230, a transition duct 240, and a turbomachine 300, similar to that depicted in FIG. 2, it will be appreciated that active noise control system 1000 may be applied to any of the aforementioned embodiments of the invention.

Audio sensor 1005 is suitably arranged for sensing noise generated at turbomachine 300, and audio speaker 1015, responsive via signal lines 1025 to audio sensor 1005, is suitably arranged for generating sound waves that at least partially cancel the noise generated at turbomachine 300. While, audio sensor 1005 and audio speaker 1015 are depicted disposed at outlet 355, they may respectively be disposed at any location suitable for sensing and canceling noise generated at turbomachinery system 200.

In an embodiment, control circuit 1010 receives an input signal from audio sensor 1005, calculates, using control theory logic and circuitry, an output signal for generating a sound wave at audio speaker 1015 that is phase-shifted with respect to the noise sensed at audio sensor 1005, and sends the output signal to audio speaker 1015, which is responsive thereto. In an embodiment, the output signal from control circuit 1010 produces a sound wave at audio speaker 1015 that is phase-shifted about 180-degrees with respect to the primary tone and power level of the noise generated at turbomachine 300, and at turbomachinery system 200 generally. In general, control circuit 1010 is designed to calculate and output a signal that results in a sound wave at audio speaker 1015 that destructively couples with the noise generated at turbomachine 300, thereby reducing the overall noise of turbomachinery system 200. Accordingly, it will be appreciated that sound waves phase-shifted by some angle other than 180-degrees may also be calculated and sent by control circuit 1010 to audio speaker 1015 as desired.

Referring now to FIGS. 2, and 27–29, heat exchanger 230 may be a foam heat exchanger 1030 made from an open-cell metallic or non-metallic foam. One suitable material for foam heat exchanger 1030 is graphitized carbon foam. Alternative materials may include aluminum foam, copper foam, and boron nitride foam. Foam materials that are electrically non-conductive but thermally conductive may be placed in direct contact with HPDD 220, while foam materials that are both electrically and thermally conductive may require an insulative interface to HPDD 220. In general, foam heat exchanger 1030 includes a porous medium having a plurality of interconnected flow paths 1035, best seen by now referring to FIG. 29, which depicts a cross section of foam heat exchanger 1030 taken perpendicular to a flow path and magnified 100 times, that may be thermally coupled to a base 1040 via brazing, compression fitting, force-controlled connectors, screws, or any other suitable means. Where base 1040 is employed, base 1040 is placed in thermal communication with HPDD 220.

In an embodiment employing active noise control system 1000, foam heat exchanger 1030, or both, turbomachine 300 draws air through foam heat exchanger 1030 and through the plurality of interconnected flow paths 1035, thereby effectively cooling HPDD 220 (shown in FIG. 3). Noise generated at turbomachine 300, or otherwise, is sensed at audio sensor 1005, which in an embodiment is disposed at outlet 355 of turbomachine 300. A signal generated at audio sensor 1005, and representative of the noise sensed, is received at control circuit 1010, which calculates an appropriate phase shift signal to be sent to audio speaker 1015. Audio speaker 1015 responds to the phase shift signal from control circuit 1010 by generating a phase-shifted sound wave that destructively couples with the noise sensed at audio sensor 1005, thereby at least partially canceling, or at least reducing, the overall noise of turbomachine 300. Accordingly, an embodiment of the invention not only provides effective cooling of HPDD 220, but also limits the noise generated by turbomachinery system 200 itself.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A turbomachinery system for cooling a high power density device, comprising:
   a turbomachine configured to deliver a high flux cooling medium, said turbomachine having a motor and a compressor driven by said motor;
   a housing containing at least one of said motor and said compressor, said housing having a passage for air flow, an inlet at a first end for accepting air flow, and an outlet at a second end for discharging air flow;
   a heat exchanger in fluid communication with said turbomachine and arranged for being thermally coupled to the high power density device; and
   a transition duct arranged intermediate said heat exchanger and said inlet for funneling air flow from said heat exchanger to said turbomachine.

2. The system of claim 1, wherein said heat exchanger comprises a porous medium having a plurality of interconnected flow paths.

3. The system of claim 2, wherein said flow paths comprise an open-cell metallic foam or an open-cell non-metallic foam.

4. The system of claim 3, wherein said porous medium comprises graphitized carbon foam, aluminum foam, copper foam, boron nitride foam, or any combination comprising at least one of the foregoing.

5. The system of claim 2, wherein said heat exchanger further comprises:
   a base thermally coupled to said porous medium, said base arranged for being thermally coupled to the high power density device.

6. The system of claim 1, further comprising:
   an audio sensor arranged for sensing noise generated at said turbomachine; and
   a noise generating device responsive to said audio sensor and arranged for at least partially canceling the noise generated at said turbomachine.

7. The system of claim 6, further comprising:
   a control circuit arranged for receiving an input signal from said audio sensor and for sending an output signal to said noise generating device;
   wherein said input signal is representative of the noise generated at said turbomachine, and said output signal is for generating a sound wave at said noise generating device that is phase-shifted with respect to the noise sensed at said audio sensor.

8. The system of claim 7, wherein said phase-shifted sound wave is phase-shifted by about 180-degrees with respect to the primary tone sensed at said audio sensor.

9. The system of claim 6, wherein said audio sensor and said noise generating device are disposed at said outlet.

10. The system of claim 6, wherein said noise generating device comprises an audio speaker.

11. The system of claim 10, wherein said audio speaker comprises an air mover comprising plastic, fiber, paper, metal, or any combination comprising at least one of the foregoing.

12. A method for cooling a high power density device, comprising:
   drawing air through a porous medium using a turbomachine, the porous medium having a plurality of interconnected flow paths and arranged for being thermally coupled to the high power density device;

compressing the air at a turbocompressor of the turbomachine, the turbomachine having an overall dimension of equal to or less than 1U; and exhausting the drawn and compressed air.

13. The method of claim 12, further comprising:

sensing a noise generated at the turbomachine; and generating a phase-shifted sound wave in response to the sensed noise for at least partially canceling the noise generated at the turbomachine.

14. The method of claim 13, wherein:

said sensing a noise comprises sensing a noise at an exhaust of the turbomachine; and said generating a phase-shifted sound wave comprises generating a phase-shifted sound wave at the exhaust of the turbomachine.

15. A method for cooling a high power density device, comprising:

drawing air through a heat exchanger using a turbomachine, the heat exchanger arranged for being thermally coupled to the high power density device;

compressing the air at a turbocompressor of the turbomachine, the turbomachine having an overall dimension of equal to or less than 1U;

sensing a noise generated at the turbomachine;

generating a phase-shifted sound wave in response to the sensed noise for at least partially canceling the noise generated at the turbomachine; and exhausting the drawn, compressed, and noise-reduced air.

16. The method of claim 15, further comprising:

receiving at a control circuit an input signal representative of the sensed noise and generating thereat an output signal phase-shifted from the input signal; and sending the output signal to a noise generating device for generating a sound wave phase-shifted with respect to the sensed noise.

17. A turbomachinery system for cooling a high power density device, comprising:

a turbomachine configured to deliver a high flux cooling medium toward the high power density device, said turbomachine having a motor and a compressor driven by said motor;

a porous heat exchanger in fluid communication with said turbomachine and arranged for being thermally coupled to the high power density device;

an audio sensor arranged for sensing noise generated at said turbomachine; and a noise generating device responsive to said audio sensor and arranged for at least partially cancelling the noise generated at said turbomachine.

18. The system of claim 17, wherein said high flux cooling medium comprises air, refrigerant, or a combination comprising at least one of the foregoing.

19. The system of claim 18, wherein said turbomachine has an overall dimension of equal to or less than 1U.

20. The system of claim 19, wherein:

said porous heat exchanger comprises graphitized carbon foam, aluminum foam, copper foam, boron nitride foam, or any combination comprising at least one of the foregoing; and said noise generating device comprises an air mover comprising plastic, fiber, paper, metal, or any combination comprising at least one of the foregoing.

* * * * *